United States Patent [19]
Bethune et al.

[11] Patent Number: 5,994,675
[45] Date of Patent: Nov. 30, 1999

[54] SEMICONDUCTOR PROCESSING FURNACE HEATING CONTROL SYSTEM

[75] Inventors: Edwin M. Bethune, Canyon Country, Calif.; Donald Olmsted, Bigfork, Mont.

[73] Assignee: Semitool, Inc., Kalispell, Mont.

[21] Appl. No.: 08/814,721

[22] Filed: Mar. 7, 1997

[51] Int. Cl.$^6$ .................................................. B23K 10/00
[52] U.S. Cl. .......................... 219/483; 219/497; 219/485; 219/413; 392/416; 374/121; 118/724; 438/663; 438/600
[58] Field of Search ............................ 219/497, 483–486, 219/412–414; 435/660, 663; 29/25.01; 374/121; 118/729; 156/345

[56] References Cited

U.S. PATENT DOCUMENTS

| | | | |
|---|---|---|---|
| 4,276,603 | 6/1981 | Beck et al. | 364/477 |
| 4,570,054 | 2/1986 | Chidzey et al. | 219/490 |
| 4,688,180 | 8/1987 | Motomiya | 364/477 |
| 4,711,989 | 12/1987 | Yu | 219/390 |
| 4,738,618 | 4/1988 | Massey et al. | 219/497 |
| 4,761,538 | 8/1988 | Chiba et al. | 219/390 |
| 4,937,434 | 6/1990 | Nakao | 364/557 |
| 5,000,682 | 3/1991 | Heidt et al. | 219/486 |
| 5,001,327 | 3/1991 | Hirasawa | 219/390 |
| 5,099,442 | 3/1992 | Furuta et al. | 364/140 |
| 5,258,601 | 11/1993 | Takano | 373/135 |
| 5,280,422 | 1/1994 | Moe et al. | 392/416 |
| 5,291,514 | 3/1994 | Heitmann et al. | . |
| 5,436,172 | 7/1995 | Moslehi | 437/8 |
| 5,517,594 | 5/1996 | Shah et al. | . |
| 5,555,725 | 9/1996 | Shimasaki et al. | 60/277 |
| 5,661,669 | 8/1997 | Mozumder et al. | 364/552 |
| 5,782,227 | 7/1998 | Abe | 123/689 |

FOREIGN PATENT DOCUMENTS

| | | |
|---|---|---|
| 0291147 | 11/1988 | European Pat. Off. . |
| 96/12386 | 4/1996 | WIPO . |

OTHER PUBLICATIONS

"Optimal Control of the Wafer Temperatures in Diffusion/LPCVD Reactors", by H. De Waard and W.L. De Koning, pp. 243–252, 1992—International Federation of Automatic Control.

Chapter 8, "System Identification", pp. 349–416. Chapter 9, "Multivariable and Optimal Control", pp. 417–483.

"Appendix 4A: Identifiability of Black–Box Miltivariable Model Structures", Models of Linear Time–Invariant Systems, pp. 114–126.

"Frequency Shaping", Chapter 9, pp. 262–289.

"Optimization Problems for Dynamic Systems", Chapter 2, pp. 42–89. "Optimization Problems for Dynamic Systems with Path Constraints", Chapter 3, pp. 90–127.

"Model Identification in Rapid Thermal Processing Systems", by Young Man Cho & Thomas Kailath—IEEE Transactions on Semiconductor Manufacturing, Aug. 1993, pp. 233–245.

(List continued on next page.)

*Primary Examiner*—Mark Paschall
*Attorney, Agent, or Firm*—Lyon & Lyon LLP

[57] ABSTRACT

A vertically oriented thermal processor supporting semiconductor wafers within a vertical processing chamber within a process tube about which a furnace heater is supported utilizes a model-base control target in combination with a heating control system configured to heat portions of the furnace in order to achieve a thermally uniform processing chamber environment. A furnace power controller implements a dynamic control system configured to achieve a desired uniform thermal distribution within the processing chamber during various processing cycles for semiconductor wafers. Preferably, the control system monitors thermal conditions within the chamber and compares the conditions with a desired thermal model of the furnace, and activates/deactivates one or more heater elements within the furnace in order to achieve a desired thermal condition within the processing chamber.

34 Claims, 28 Drawing Sheets

OTHER PUBLICATIONS

"Modeling, Identification, and Control of Rapid Thermal Processing Systems", by Charles Schaper et al., Journal of the Electrochemical Society, Sep. 1993, pp. 1–29 and drawings.

"Temperature Distribution in Semiconductor Wafers Heated in a Vertical Diffusion Furnace", by Shigeki Hirasawa et al., IEEE Transactions on Semiconductor Manufacturing, Aug. 1993, pp. 226–232.

"Optimization of Transient Temperature Uniformity in RTP Systems", by Stephen Norman, IEEE Transactions on Electron Devices, Jan. 1992, pp. 205–207.

"Control of MMST RTP: Repeatability, Uniformity, and Integration for Flexible Manufacturing", by Charles Schaper et al., IEEE Transactions on Semiconductor Manufacturing, pp. 1–24 and drawings.

"Adaptive Temperature Control of Industrial Diffusion/LPCVD Reactors", by H. De Waard & W.K. De Koning, IFAC Intelligent Tuning and Adaptive Control, Singapore, 1991.

T.A. Badgwell et al., "In situ measurement of wafer temperature in a low pressure chemical vapor deposition furnace", *American Institute of Physics,* pp. 1129–1133.

B. J. Van Schravendijk et al., "Modeling and control of the wafer temperatures in a diffusion furance", *Journal of Applied Physics,* Feb. 15, 1987, pp. 1620–1627.

Peter H. Singer: "Trends in Vertical Diffusion Furnaces"; Apr. 1986; 5 pages.

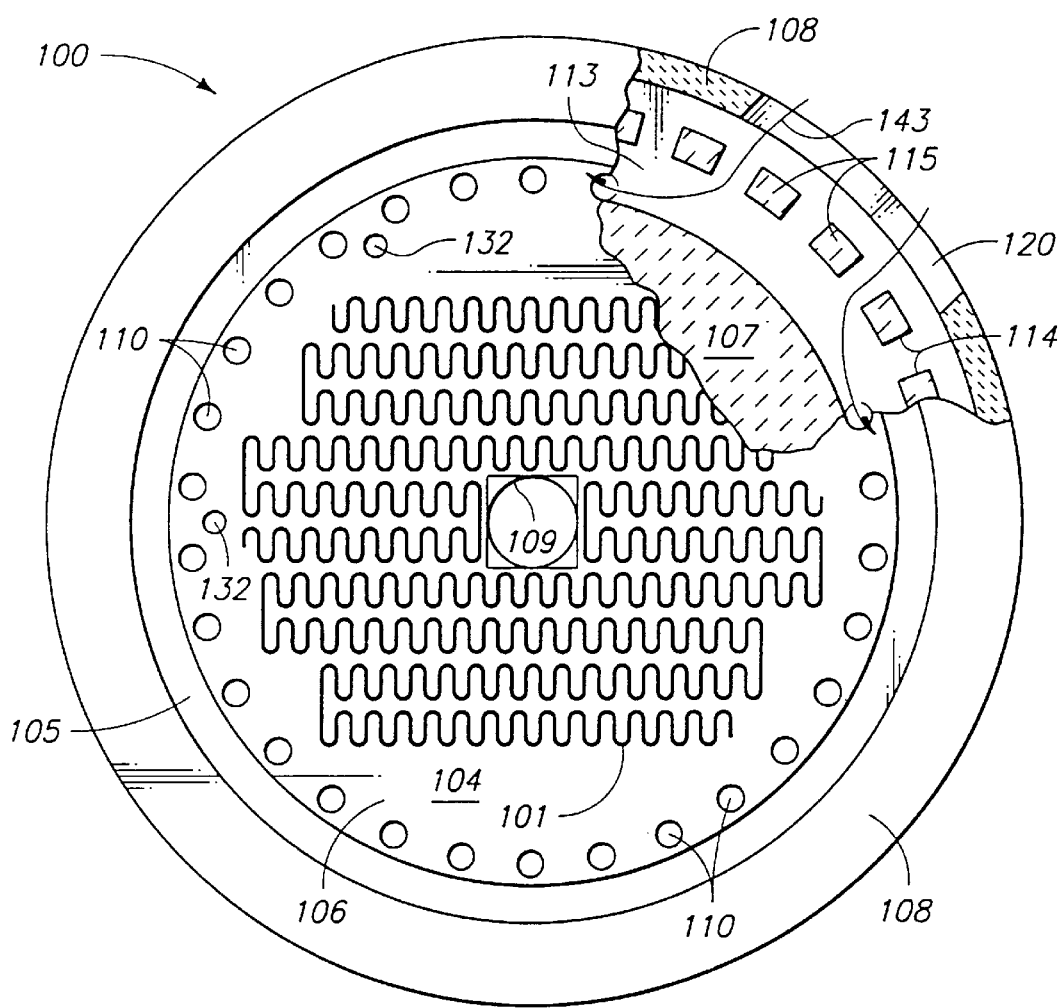
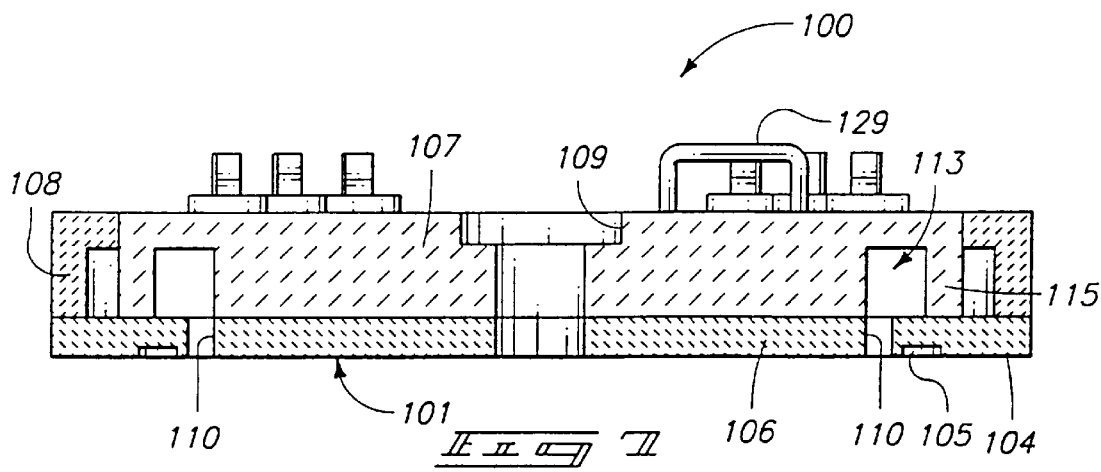

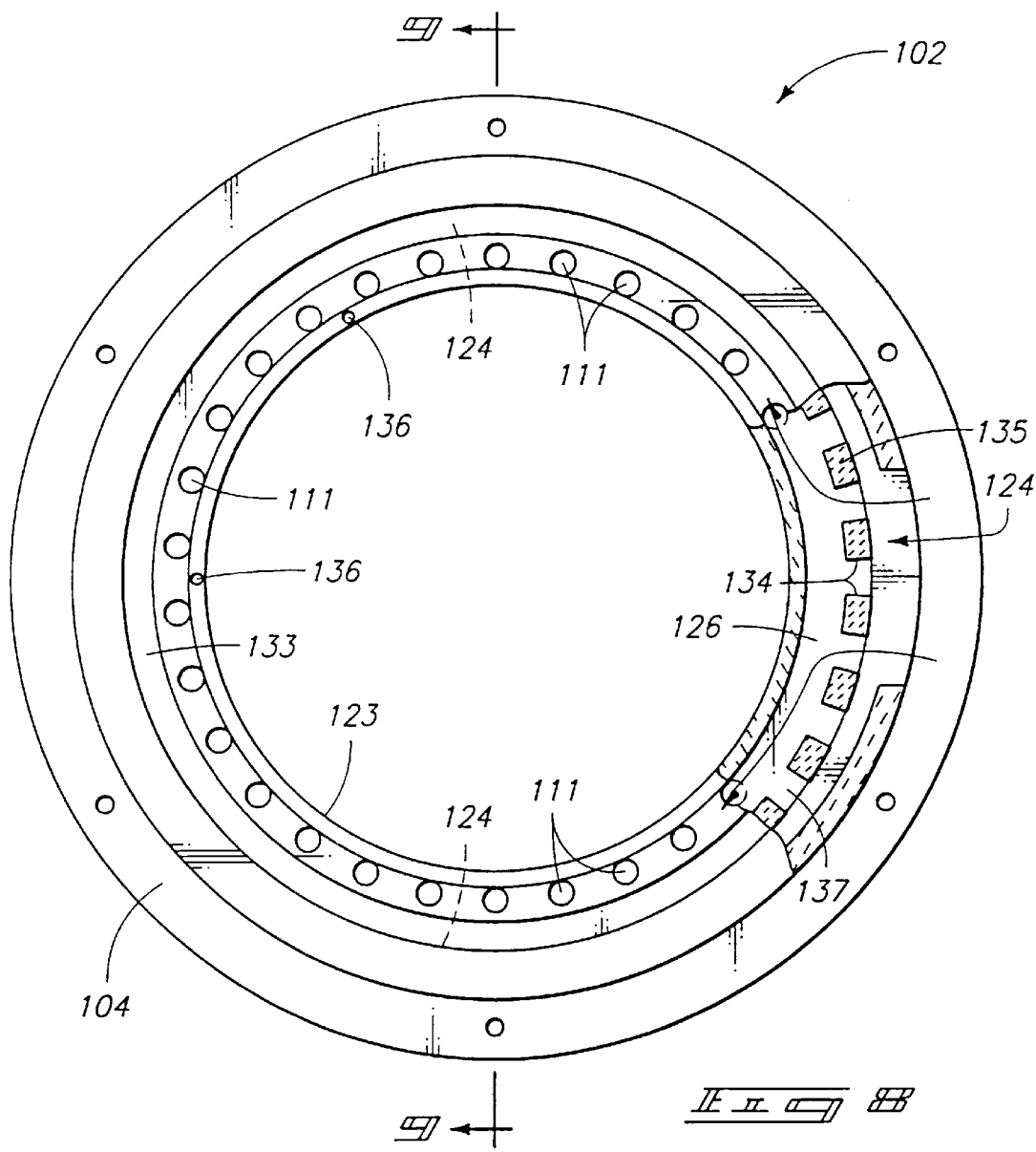
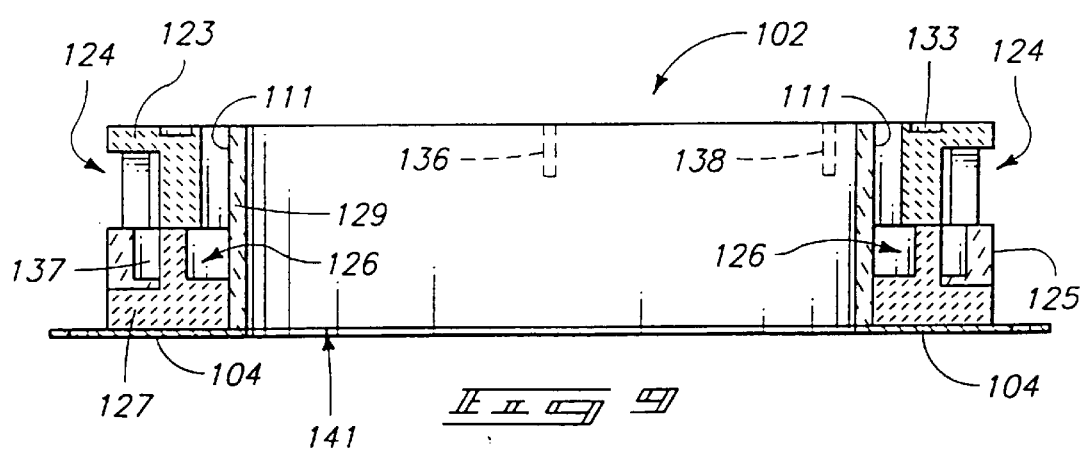

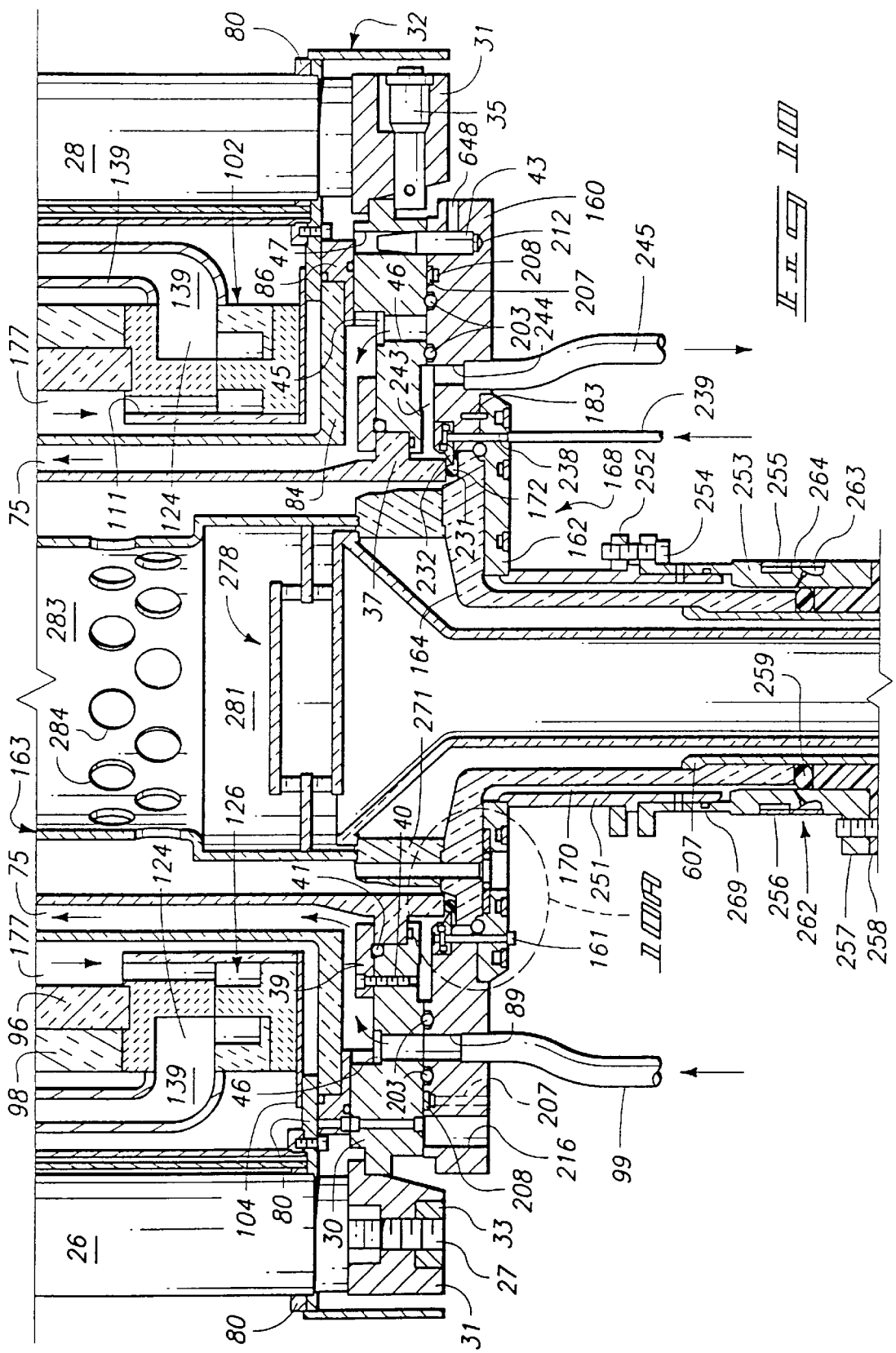

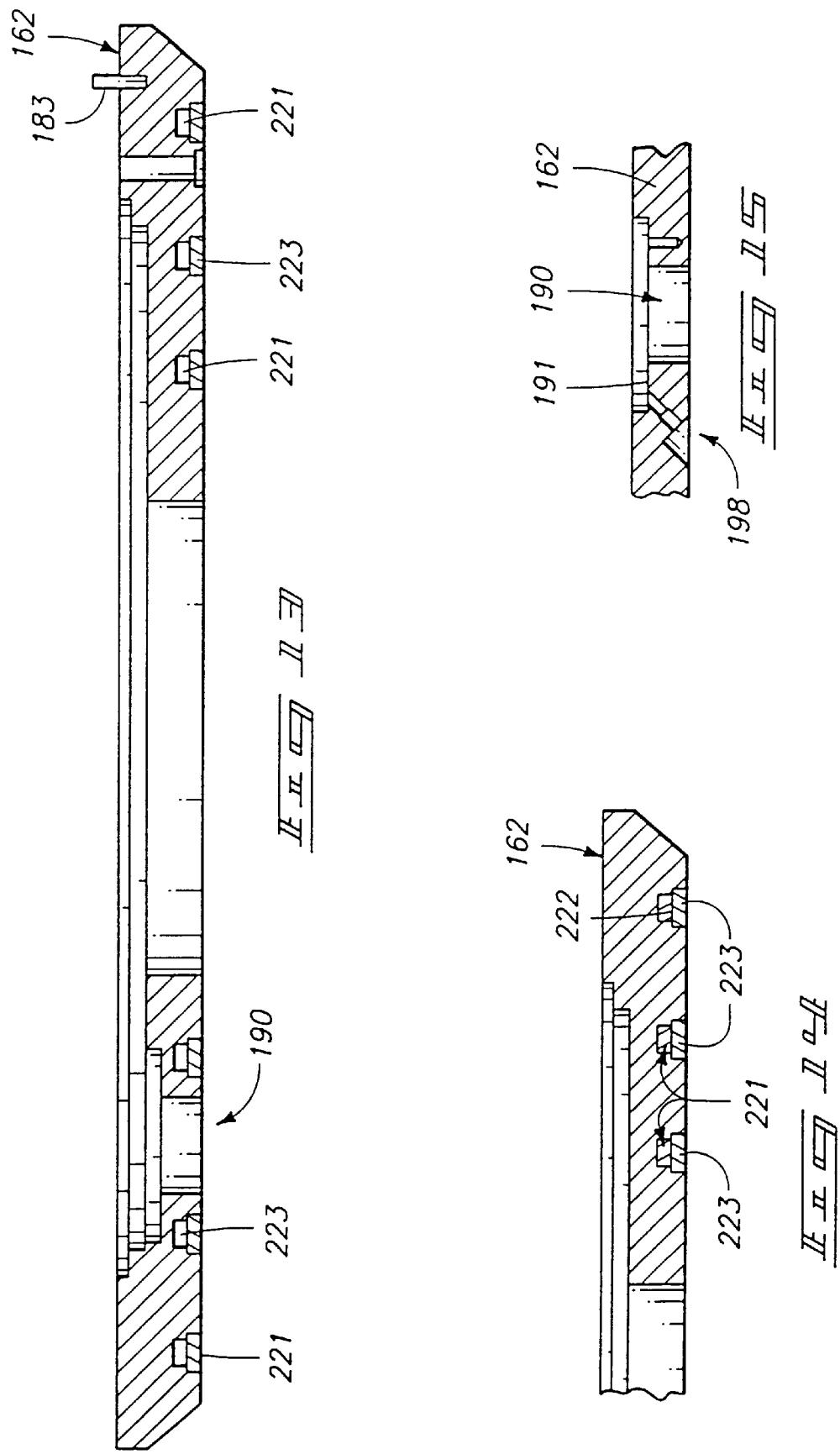

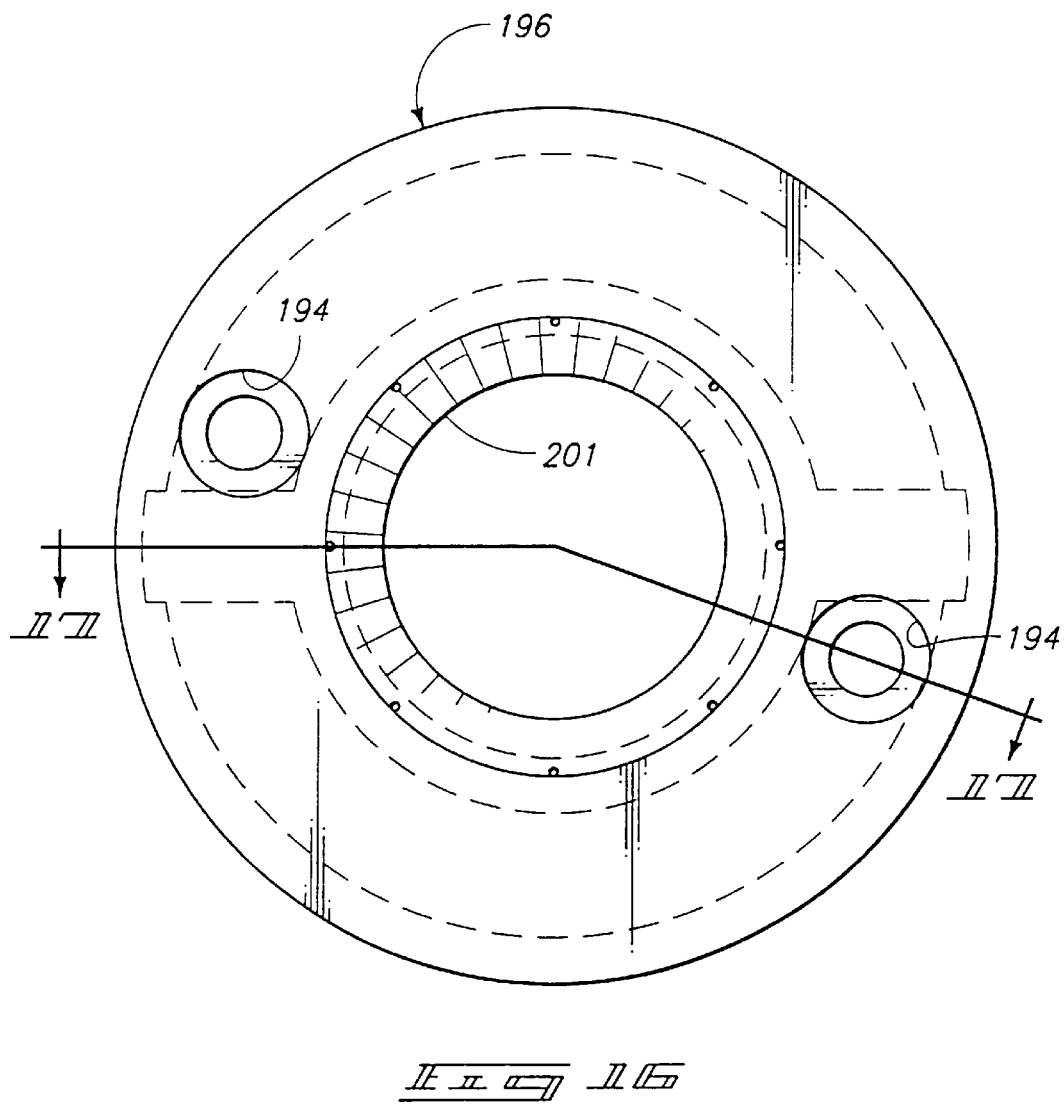
_FIG 16_

SEMICONDUCTOR PROCESSING FURNACE HEATING CONTROL SYSTEM

TECHNICAL FIELD

The apparatus and methods described below pertain to thermal processors for semiconductor wafers, and more particularly to an improved semiconductor processing furnace and methods of processing.

BACKGROUND OF THE INVENTION

In the thermal and chemical processing of semiconductor wafers, it is highly desirable to very accurately control the thermal and gaseous treatment to which the wafers are exposed during processing. Typically, batches of wafers are processed in a semiconductor processing furnace having an processing chamber which can be controllably enclosed. The processing environment within the enclosed processing chamber is carefully controlled to effect the desired processes.

Early designs for semiconductor diffusion processing furnaces were configured with the wafer array and processing chamber in a horizontal orientation. This was apparently done in an attempt to obtain products having more uniform characteristics. However, the desired uniformity was not easily achieved and horizontal furnaces suffered some disadvantages because of their configuration. In some furnaces it became difficult to achieve uniformity when performing high pressure oxidation or silicon deposition processes. These furnaces also proved difficult in achieving desired quality levels for the wafer or other semiconductor articles being processed.

In response to problems experienced by horizontal diffusion furnaces, alternative designs were developed. Furnaces having vertically arranged wafer arrays and processing chambers were made in an effort to provide better control of temperature and other processing parameters. U.S. Pat. No. 4,738,618 issued to Robert G. Massey et al. on Apr. 19, 1988 shows a vertically oriented thermal processor having a vertically adjustable furnace assembly and process tube. The process tube, constructed from a quartz bell jar, is vertically moveable in up and down directions within a supporting framework in conjunction with a likewise moveable furnace assembly. Additionally, the furnace assembly and process tube are moveable together between up and down positions, as well as independently of one another. Heat is supplied to the thermal processor when the furnace assembly and process tube are both lowered into the down position by controlling operation of heating elements within the furnace assembly. To cool the process tube within the thermal processor, the operation of the heating elements is regulated such that interior heat is dissipated to the exterior of the processor by convection. Although this vertical furnace design provided significant improvements, further improvements were found desirable to achieve greater temperature uniformity and better control over other processing parameters.

One design challenge associated with the above vertical furnace design included a tendency for the thermal processor to collect deposits of contaminants on the inner surface of the quartz process tube under certain treatment procedures. In an effort to address these problems, U.S. Pat. No. 5,000,682, issued to Donald W. Haight et al. on Mar. 19, 1991 presented a vertical furnace design that separates the furnace into a pre-heat and post-cool area in which the wafers are processed and in which gaseous or vapor treatments are conducted.

Another area of continuing design challenge is to more quickly cool the wafer array and processing chamber after high temperature thermal processing has been completed. Rapid cooling needs to be done in a uniform manner to help minimize the risks of processing variations between wafers and between different batches of wafers.

Relatively rapid but uniform cooling is also desired in order to minimize overall thermal exposure. Thermal exposure can have deleterious effects upon layers of the semiconductor article which have been previously processed. This is widely recognized by the term thermal budget which indicates that a wafer has a budget for the degree of exposure to elevated temperature processes. The effects are not linear with temperature, but instead have increasingly significant effects with higher temperatures. Examples of deleterious effects associated with added high temperature exposure include temperature induced crystal defects or deviations, and undesired additional diffusion of dopants or other materials within the matrix of the semiconductor article being processed. Thus it is desirable to bring a batch of wafers being processed within a furnace up to a desired processing temperature relatively rapidly, and to cool the wafers also in a relatively rapid manner. These goals are further emphasized because overall processing time and costs can be reduced if the processing time can be reduced.

Another challenge in the design of semiconductor thermal processors is with regard to more quickly achieving a desired temperature environment within the process chamber so that wafers or other semiconductor articles are heated at uniform rates and to uniform temperatures. The desired uniformity is variable in both axial and radial directions relative to the array of wafers being processed. Particularly, there is a need to realize a desired, or pre-defined thermal processing model in the processing chamber during a processing step in order to produce processed wafers having better uniformity. Particularly, problems can be encountered due to axial and radial variations in temperature between different regions of the processing chamber. The ability to control these variations becomes more difficult as faster thermal ramp-up and ramp-down targets are attempted in the process chamber. Therefore, improvements in furnace design are necessary in order to achieve an aggressive reduction in cycle time without a degradation in uniformity of processed wafers. The arrangement of heating elements and cooling fluids used in and around the processing chamber creates a delay in thermal response of the process chamber temperature which makes accurate dynamic control of the temperature during ramp-up, ramp-down and changing temperature rate conditions particularly difficult.

A further problem posed by the use of presently available semiconductor vertical processing furnaces results when processing gases are exposed to non-inert furnace components within the process chamber. Typically, wafers must be processed in a controlled environment in order to prevent undesirable oxidation. Ideally, the environment should be nearly inert. For example, inert gas is used during certain annealing processes. However, materials which are not completely inert and that are in fluid contact with the processing gases can produce off-gassing of one or more constituents. Such off-gassing can introduce contaminants into the processing chamber which mix with processing gases. The high temperature conditions and mixing of processing gases within the processing chamber can lead to introduction of such contaminants into the wafers of other semiconductor articles being processed.

There is also a significant problem with regard to the handling of semiconductor processing waste streams. In the case of semiconductor furnaces, the processing chambers are typically supplied with various gases during thermal processing. Since processing pressures are typically atmospheric or subatmospheric, the flow of processing gases into the processing chamber requires an approximate flow of spent gases from the processing chamber. These spent processing gases are typically at relatively high temperatures which cause problems in handling and disposal. Thus there is a need for thermal processors having improved waste stream outflows which can be more easily handled.

These and other considerations have led to the improved designs and processes described herein.

BRIEF DESCRIPTION OF THE DRAWINGS

The preferred embodiment of the invention is illustrated in the accompanying drawings which are briefly described below.

FIG. 6 is a bottom view of a top portion of the heating enclosure subassembly shown in FIG. 5.

FIG. 7 is a sectional view of the top portion taken along line 7—7 of FIG. 5.

FIG. 8 is a bottom plan view of the bottom of the heating enclosure subassembly.

FIG. 9 is a sectional view taken along the line 9—9 of FIG. 8.

FIG. 10 is an enlarged partial sectional view showing portions of the base plate assembly and pedestal assembly shown in FIG. 4.

FIG. 13 is an enlarged sectional view taken along the line 13—13 of FIG. 11.

FIG. 14 is an enlarged partial sectional view taken along the line 14—14 of FIG. 12.

FIG. 15 is an enlarged partial sectional view taken along the line 15—15 in FIG. 11.

FIG. 16 is an enlarged plan view of an air distribution disk shown in FIG. 10.

DETAILED DESCRIPTION OF THE PREFERRED EMBODIMENTS

Figure 1:
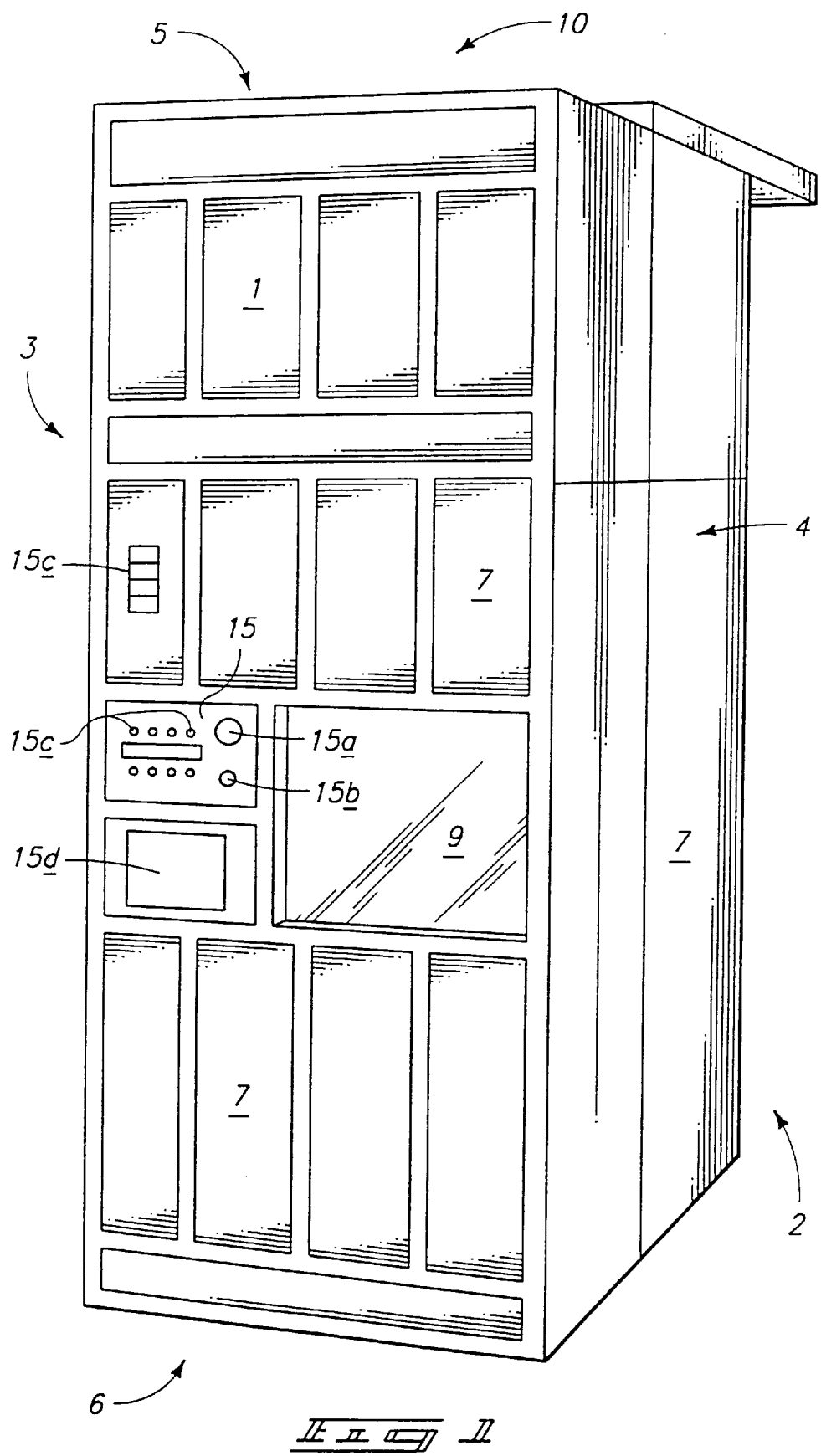
FIG. 1 is a perspective view of a preferred vertical thermal processor according to this invention.

This disclosure of the invention is submitted in furtherance of the constitutional purposes of the U.S. Patent Laws "to promote the progress of science and useful arts" (Article 1, Section 8).

TABLE 1

Listing of Subsections of Detailed Description and
Pertinent Items with Reference Numerals and Page Numbers

| | |
|---|---|
| Thermal Processor Generally | 13 |
| vertical thermal processor 10 | 13 |
| front 1 | 13 |
| back 2 | 13 |
| first side 3 | 13 |
| second side 4 | 13 |
| top 5 | 13 |
| bottom 6 | 13 |
| exterior surface panels 7 | 14 |
| structural framework 24 | 14 |
| access door 9 | 14 |
| loading chamber 11 | 14 |
| internal partitions 11a | 14 |
| front operator control panel 15 | 15 |
| stop control 15a | 15 |
| a run or start control 15b | 15 |
| indicator lights 15c and 15e | 15 |
| display and control input station 15d | 15 |
| tail section 42 | 15 |
| Wafer Inventory | 15 |
| inventory stand 13 | 16 |
| upper support deck 13a | 16 |
| lower support deck 13b | 16 |
| wafer cassettes 17 | 16 |
| wafers 14 | 16 |
| Wafer Transfer Mechanism | 16 |
| wafer transfer mechanism 48 | 16 |
| engagement or contact head 47 | 17 |

TABLE 1-continued

Listing of Subsections of Detailed Description and
Pertinent Items with Reference Numerals and Page Numbers

| | |
|---|---|
| Pre-Load and Cooling Boats | 17 |
| pre-load boat 54 | 17 |
| upright standards 49 | 17 |
| cooling boat 56 | 18 |
| Processing Boat | 18 |
| processing boat 12 | 18 |
| processing boat base 23 | 18 |
| upright standards 19 | 18 |
| notches 21 | 19 |
| Processing Head Assembly | 19 |
| head assembly or head 25 | 19 |
| processing tube or jar 18 | 19 |
| furnace heater assembly 22 | 19 |
| Processing Head Support and Actuation | 20 |
| head assembly suspension plate 131 | 20 |
| head support framework 133 | 20 |
| guide tracks 135 | 20 |
| head support superstructure frame portion 137 | 21 |
| guide track receiving channels 135a | 21 |
| head assembly actuators 28 | 21 |
| actuator rods 79 | 21 |
| Processing Vessel Assembly | 22 |
| processing chamber 16 | 22 |
| processing tube or jar 18 | 22 |
| wall or shell 20 | 22 |
| Processing Tube Lift Assembly | 23 |
| processing tube lift ring 30 | 23 |
| processing tube lift actuators 26 | 23 |
| lift actuation rods 27 | 23 |
| peripheral or outer lift ring 31 | 23 |
| threaded fasteners 33 | 24 |
| detachable retainer pins 35 | 24 |
| bottom flange 37 | 24 |
| flange retainer 39 | 24 |
| retainer fasteners 40 | 24 |
| flange seal 41 | 24 |
| locator pin receptacles 47 | 24 |
| locator pins 43 | 24 |
| locator pin keepers 648 | 24 |
| cooling fluid ports 45 | 25 |
| annular distribution groove or channel 46 | 25 |
| cooling fluid passageway 89 | 25 |
| Furnace Heater Assembly Canister | 25 |
| furnace heater assembly 22 | 25 |
| canister 76 | 26 |
| side wall or walls 77 | 26 |
| water jacket space 77a | 26 |
| canister top ring 119 | 27 |
| upper actuator mounting ring 116 | 27 |
| bottom flange ring 80 | 27 |
| peripheral heat shield 32 | 27 |
| Heating Enclosure Subassembly | 27 |
| heating enclosure subassembly 88 | 28 |
| circumferential segments 90–96 | 28 |
| end segment 100 | 28 |
| base segment 102 | 28 |
| electrical resistance heating elements 101 | 28 |
| secondary insulation layer 98 | 30 |
| protective jacket or skin 103 | 30 |
| end segment 100 | 30 |
| lower face 104 | 30 |
| annular recess 105 | 30 |
| first or interior piece 106 | 31 |
| second or main piece 107 | 31 |
| third or outside piece 108 | 31 |
| cooling fluid passageways 143 | 31 |
| interior ports 110 | 31 |
| second piece 108 | 31 |
| annular inner manifold chamber 113 | 32 |
| manifold connecting passages 114 | 32 |
| manifold chamber shields 115 | 32 |
| annular outer manifold chamber 116 | 32 |
| exterior ports 120 | 32 |
| heating element connection terminals 140–152 | 32 |
| handles 129 | 33 |
| end segment central apertures 109 | 33 |

TABLE 1-continued

Listing of Subsections of Detailed Description and
Pertinent Items with Reference Numerals and Page Numbers

| | |
|---|---|
| heater base 102 | 33 |
| first part 123 | 33 |
| second part 125 | 33 |
| third part 127 | 33 |
| fourth part 129 | 33 |
| annular recess groove 133 | 33 |
| cooling fluid interior ports 111 | 34 |
| annular inner manifold chamber 126 | 34 |
| manifold connecting passages 134 | 34 |
| manifold chamber shields 135 | 34 |
| annular outer manifold chamber 137 | 34 |
| exterior ports 124 | 34 |
| central opening 141 | 35 |
| heating enclosure bottom ring 104 | 35 |
| Furnace Heater Liner | 35 |
| furnace liner 82 | 35 |
| mounting flange 84 | 36 |
| liner mounting ring 86 | 36 |
| liner face seal 138 | 36 |
| liner dome 83 | 36 |
| first cooling circuit connection fitting 85 | 36 |
| first cooling circuit connection conduit 122 | 36 |
| Furnace Sensors | 37 |
| temperature sensor arrays 128 | 37 |
| sensor mounting apertures 132 | 37 |
| sensor receptacles 136 | 37 |
| Base Plate Assembly | 37 |
| base plate assembly 168 | 37 |
| main base plate member 160 | 38 |
| base support member 162 | 38 |
| fasteners 161 | 38 |
| dowel pin 183 | 38 |
| base throat piece 164 | 38 |
| main processing chamber seal 172 | 39 |
| first cooling fluid supply passage 89 | 40 |
| supply fitting or tube 99 | 40 |
| annular coolant channel 208 | 40 |
| connecting passages 207 | 41 |
| channel covers 223 | 41 |
| dams 222 | 41 |
| peripheral recessed shoulder 231 | 42 |
| seal retainer 232 | 42 |
| retainer cap piece 234 | 42 |
| seals 235 and 236 | 42 |
| annular flow distribution space 237 | 42 |
| coolant supply passageway 238 | 43 |
| coolant supply line 239 | 43 |
| annular main seal space 243 and is passed through a | 43 |
| main seal coolant outflow passageway 244 and associated | 43 |
| coolant outflow conduit 245 | 43 |
| accessory fittings 174 | 43 |
| gas delivery tube 176 | 43 |
| profile thermocouple arrays 180 | 43 |
| O-ring seal 182 | 44 |
| port 184 | 44 |
| support port 190 | 44 |
| ports 184 and 190 | 44 |
| recessed regions 191 | 45 |
| cooling air distribution disk 196 | 45 |
| fasteners 193 | 45 |
| apertures 194 | 45 |
| central aperture 201 | 45 |
| cooling supply port 198 | 45 |
| annular distribution cavity 216 | 45 |
| exhaust ports 199 | 45 |
| beveled O-ring seat 200 | 45 |
| base cooling cavity 170 | 46 |
| exit duct 251 | 46 |
| exit duct end piece 253 | 46 |
| fasteners 254 | 46 |
| seal 261 | 46 |
| seal 269 | 46 |
| cooling gas ports 262 | 46 |
| distribution channel 263 | 46 |
| cover 264 | 46 |
| cooling channel 255 | 46 |

TABLE 1-continued

Listing of Subsections of Detailed Description and
Pertinent Items with Reference Numerals and Page Numbers

| | |
|---|---|
| cooling channel cover 256 | 46 |
| exit duct bottom flange 257 | 47 |
| J-hook fasteners 258 | 47 |
| outflow main seal 259 | 47 |
| outflow seal heat shield 607 | 47 |
| Pedestal Assembly | 47 |
| pedestal assembly 163 | 47 |
| pedestal collar 271 | 47 |
| accessory apertures 272 | 47 |
| shoulder 273 | 47 |
| pedestal cylinder 281 | 48 |
| pedestal headpiece 283 | 48 |
| pedestal holes 284 | 48 |
| locating projections 336 | 48 |
| central recessed area 286 | 48 |
| Fluid Cooling Circuits | 49 |
| first or inner fluid cooling circuit | 49 |
| first flow path 75 | 49 |
| second or outer fluid cooling circuit | 49 |
| second flow path 77 | 49 |
| cooling fluid supplies 99 | 49 |
| passageways 89 | 49 |
| annular chamber 46 | 49 |
| ports 45 | 49 |
| connection fitting 85 | 49 |
| conduit 122 | 49 |
| flange 341 | 50 |
| spring-loaded gasket 342 | 50 |
| flow plenum 349 | 50 |
| high temperature packing 347 | 50 |
| flow mover 350 | 50 |
| outlet 351 | 50 |
| exterior ports 120 | 51 |
| annular manifold chamber 118 | 51 |
| ports 110 | 51 |
| passageways 111 | 51 |
| annular chamber 126 | 51 |
| side ports 124 | 51 |
| riser ducts 139 | 51 |
| Process Chamber Outflow | 51 |
| top baffle 501 | 51 |
| second or intermediate baffle 503 | 52 |
| central aperture 504 | 52 |
| spacers 505 | 52 |
| third or bottom baffle 508 | 52 |
| peripheral openings or notches 509 | 52 |
| peripheral spokes or lungs 510 | 52 |
| inner liner 520 | 52 |
| top peripheral flange 521 | 52 |
| entrance or mouth 522 | 52 |
| exit or discharge 527 | 52 |
| upper portion 523 | 52 |
| lower portion 524 | 52 |
| Processing Chamber Outflow Cooler | 53 |
| outflow cooler 600 | 53 |
| outflow cooler sleeve or casing 602 | 53 |
| casing top flange 604 | 53 |
| discharge port 609 | 54 |
| casing bottom shoulder 608 | 54 |
| outflow cooler lining 605 | 54 |
| coupling head or flange 606 | 54 |
| flow diverter 630 | 55 |
| top end 631 | 55 |
| bottom end wall 632 | 55 |
| vent hole 635 | 55 |
| flow diverter feet 636 | 55 |
| bottom end wall 632 | 55 |
| tee 651 | 56 |
| gas discharge line 653 | 56 |
| elevated section 654 | 56 |
| control valve 658 | 56 |
| valve controller 659 | 56 |
| purge fitting 660 | 56 |
| purge flow control valve 665 | 56 |
| liquids discharge branch 680 | 56 |
| flush connector 681 | 56 |

TABLE 1-continued

Listing of Subsections of Detailed Description and
Pertinent Items with Reference Numerals and Page Numbers

| | |
|---|---|
| flush control valve 683 | 57 |
| flow indicator 684 | 57 |
| gas trap 687 | 57 |
| Methods and Operation | 57 |
| Furnace Power Controller | 61 |
| furnace power controller 350 | 61 |
| model based controller 352 | 61 |
| control system 348 | 62 |
| power controller circuit 354 | 63 |
| silicon controlled rectifiers (SCR) 392 | 63 |
| microprocessor based host computer 356 | 64 |
| serial communications link 358 | 64 |
| communication interface 360 | 64 |
| dedicated microprocessor 362 | 64 |
| pair of power measurement circuits 366 and 367 | 65 |
| SCR trigger timing circuits 368 and 370 | 65 |
| separate power switch circuit 372 and 374 | 66 |
| PLL clock generator circuit 380 | 66 |
| A/D converter 386 and 388 | 66 |
| synchronous voltage to frequency (V–F) converter 390 and 392 | 66 |
| metal oxide varistor (MOV) 394 | 67 |
| resistor/capacitor (RC) snubber 396 | 67 |
| diode steering logic circuitry 398 | 67 |
| phase locked loop circuit 400 | 69 |
| digital counter 402 | 69 |
| gating circuits 404 | 69 |
| high frequency voltage controlled oscillator (VCO) 406 | 69 |
| zero cross detector at input line 408 | 69 |
| step down transformer 410 | 70 |
| current transformer 412 | 70 |
| analog multiplier 414 | 70 |
| voltage output along line 418 | 71 |
| analog input 420 | 71 |
| counter 422 | 71 |
| latch 424 | 71 |
| General Controller | 73 |
| processing fluids control valves 803 | 74 |
| wafer transfer sub-controller 804 | 74 |
| Manner of Making | 74 |

\* \* \* (End of Table 1) \* \* \*

Thermal Processor Generally

FIG. 1 shows a preferred vertical thermal processor 10 according to this invention. Processor 10 has a front 1, back 2, first side 3, second side 4, top 5, and bottom 6. FIG. 1 shows a number of exterior surface panels 7 which are used to provide a general covering and improved appearance of the overall machine when fully assembled. Surface panels 7 are attached to a structural framework 24 (shown in FIG. 2).

Figure 2:
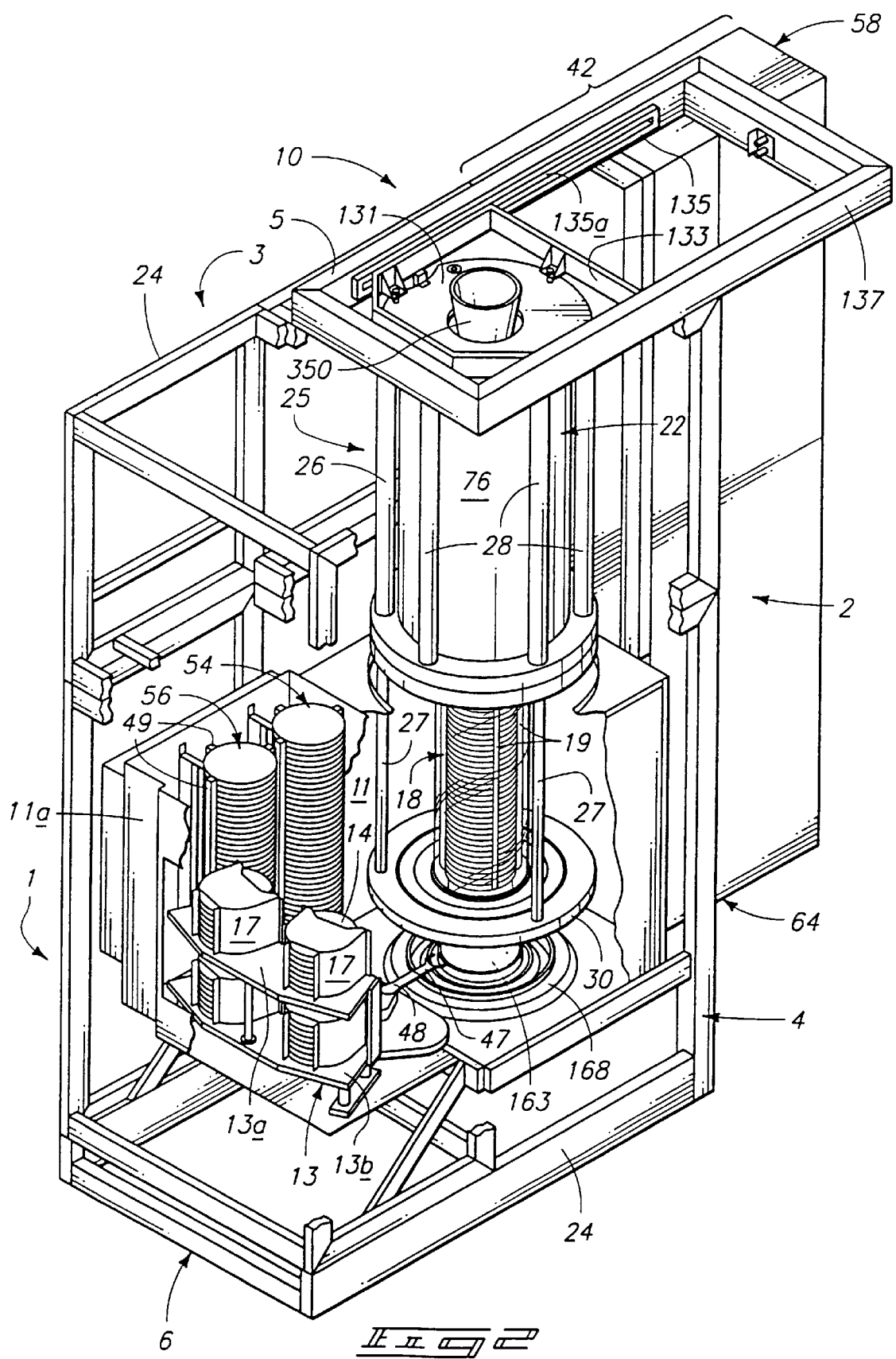
FIG. 2 is a perspective view showing the processor of FIG. 1 with some portions broken away and removed to reveal internal components of the system.

The front 1 of processor 10 includes an access door 9 which is mounted for slidable action to allow access to a loading chamber 11 shown in FIG. 2. Access door 9 is moved into a retracted condition to allow a human operator to place wafers or other semiconductor articles into and remove them from the loading compartment 11. Loading compartment 11 is enclosed to protect the wafers against contamination and serves the functions of inventorying the wafers, holding the wafers in preparation for loading into the processing chamber, and holding the wafers for further cooling after the wafers have been removed from the processing chamber.

FIG. 2 also shows that in order to further minimize contamination of the wafers and the introduction of contaminants into a processing chamber 16, the loading chamber 11 is separated from other sections of the thermal processor by several internal partitions 11a. The loading chamber is preferably supplied with highly filtered air or other environmental gas to reduce contamination. The preferred filtered air supply is not illustrated, but is contained above the loading chamber to the left in FIG. 2.

FIG. 1 also shows the front operator control panel 15. Front operator control panel 15 is accessible from the cleanroom side of the thermal processor. As shown, control panel 15 includes a stop control 15a, a run or start control 15b, and a series of indicator lights 15c and 15e which show various operational states or conditions. The front operator control panel 15 also preferably includes a touch screen display and control input station 15d which both displays information used by the human operator and allows the operator to input various information and make selections concerning the desired processing recipe and other operational parameters. A rear or maintenance display (not shown) can advantageously be included at the rear 2 of the thermal processor. This optional maintenance display and control input station is available from the grey room side of the thermal processor.

The outer configuration and front face of the thermal processor facilitates mounting in either single installations or in groups wherein multiple processors 10 are arranged side by side. Maintenance is facilitated by using a tail section 42 provided in a back portion of the processor. The tail section is of reduced width to allow maintenance personnel to access the back of the processor from the grey room side, thus facilitating maintenance and cleaning.

Wafer Inventory

Refer now to FIG. 2 which shows internal components of thermal processor 10. At the front in FIG. 2 is an inventory in the form of an inventory stand 13. Inventory stand 13 can be of various constructions. As shown the inventory stand is provided with two support levels in the form of upper support deck 13a and lower support deck 13b. The inventory stand holds a suitable number of wafer cassettes 17, such as the four shown. The wafer cassettes are preferably supported upon the inventory decks 13a and 13b in a specific position such as by registration of the cassettes with registration features of the deck (not specifically shown).

Each wafer incoming cassette is provided with wafers 14 which are ready for thermal processing. Outgoing cassettes contain wafers which have already been processed.

The inventory stand also serves as a product input-output section which is typically loaded in a manual fashion by a human operator via door 9. Alternative means for loading and unloading can also be employed, such as automated wafer handling equipment (not shown) which place the wafer cassettes 17 in appropriate locations for processing.

Wafer Transfer Mechanism

Adjacent to the input-output section is a wafer transfer mechanism 48. Wafer transfer mechanism 48 can be of various types either custom made or commercially available. The preferred wafer transfer mechanism has an engagement or contact head 47 which contacts the wafers. The engagement head can advantageously include a vacuum port (not shown) which helps secure a wafer in position upon the contact head. The preferred wafer transfer mechanism has the ability to rotate or pivot to assume various angular positions, as well as to extend and retract laterally to achieve different degrees of radial extension relative to its central pivot axis. The wafer transfer can also be controllably elevated to remove and replace wafers from the cassettes 17 held in the input-output inventory 13. Wafer transfer 48 also moves wafers to several other positions within the processor as will be explained further below.

Pre-Load and Cooling Boats

FIG. 2 further illustrates that processor 10 also includes a pre-load boat 54 which receives wafers from the input-output inventory 13 via wafer transfer 48. Pre-load boat 54 is used to store a pre-load array of wafers 14 in anticipation of movement of the wafers into the processing chamber which will be described more fully below. The pre-load boat is preferably a stand formed of quartz or other suitable materials having a series of receivers formed therein at spaced vertical positions. The receivers are advantageously formed by notches formed into upright standards 49. In the preferred construction there are three standards which form the pre-load boat 54. The wafer transfer 48 moves to the desired vertical height position and moves the contact member 47 toward pre-load boat 54. The wafer transfer then installs the wafer onto or removes the wafer from the pre-load boat depending upon whether the wafer is being loaded or unloaded therefrom.

FIG. 2 also shows a cooling boat 56 which is constructed substantially the same as the pre-load boat 54 just described. The cooling boat receives wafers which have been thermally processed and are still at elevated temperatures. The wafers are positioned into the cooling boat to form a cooling boat array from which heat dissipates. This allows the processing chamber to be utilized for loading the next batch of wafers being processed even though the wafers are sufficiently hot that further cooling is needed before they are placed in wafer carriers 17.

Processing Boat

FIG. 2 also shows a processing boat 12 which is vertically arranged to hold a processing array of wafers 14 or other semiconductor articles being processed. The processing boat is positioned in a stationary position upon a pedestal assembly 163 and base plate assembly 168 both of which will be described more fully below.

The processing boat includes a processing boat base 23 (see FIG. 3) and a plurality of upright standards 19 each of which has a series of notches 21 into which the wafers are received. This forms a vertical array having a series of receivers which hold the wafers during processing.

Wafers are loaded into and unloaded from the processing boat 12 using the wafer transfer 48 in a manner substantially the same as described above in connection with the loading and unloading of the pre-load boat 54. Wafers are taken from the pre-load boat and moved by the wafer transfer to the processing boat. After processing, the processed wafers are moved by the wafer transfer to the cooling boat 56.

Processing Head Assembly

The thermal processor 10 includes a processing head assembly which is generally referred to as head assembly or head 25. The head assembly is deployed from above. The head assembly includes a processing tube or jar 18 which is preferably in a form similar to a bell jar. The processing head assembly is constructed so as to allow the processing jar to move upwardly and downwardly over the wafer array. When deployed downwardly the processing jar covers the wafer array and seals against the base plate assembly 168 to form a substantially enclosed processing chamber 16.

The head assembly 25 also includes furnace heater assembly 22. The furnace heater assembly 22 is used to insulate and heat the array of wafers held on the processing boat. The processing head assembly is constructed to allow the furnace heater assembly to move upwardly and downwardly. The heater assembly and processing jar are constructed to form a coaxial arrangement so that the processing jar can be received within the heater assembly 22.

Processing Head Support and Actuation

FIG. 2 shows that the head assembly 25 is advantageously suspended from a head support which advantageously includes head assembly suspension plate 131. The suspension plate or piece 131 is connected to a head support framework 133 using detachable fasteners. The head support framework 133 is mounted for movement to facilitate maintenance by allowing the head assembly to be moved to the back of the thermal processor. In particular, the head support framework 133 is movable to facilitate changing of the processing tube 18 in a convenient manner at the back of the processor. As shown, the support framework is mounted for translational movement so as to allow movement frontwardly or rearwardly relative to the stationary frame 24 of the thermal processor. This is advantageously accomplished using a support carriage which is formed in-part by the support framework 133 and suspension plate 131. The support carriage also includes a plurality of rollers (not illustrated) which are guided by two complementary guide tracks 135 mounted upon a head support superstructure frame portion 137 which forms part of the stationary frame 24 of the processor. The guide tracks preferably have guide track receiving channels 135a which receive the rollers and restrain motion in either the up or down directions. Translational motion of the support carriage within a defined range of the guide tracks is allowed. The frame 24 is constructed to allow movement of the head assembly rearward when the head assembly is in an up position. The head assembly can then be moved toward the back portions of the machine and accessed adjacent to the tail section 42 for maintenance.

The head assembly 25 is advantageously suspended from the support plate or piece 131 using head assembly actuators 28. Head assembly actuators 28 have main parts which are carried with the canister 76 described below. Actuators 28 also have extendible and retractable actuator rods 79 (FIG. 3) with upper, distal ends. The distal ends are securely fastened to the support plate 131. When actuators 28 are extended, the head assembly moves downwardly to lower the furnace heater about the processing chamber for thermal processing. Lift actuators 28 can be of various types. One preferred construction uses pneumatically powered rams. Alternative actuators, such as electrically powered mechanical screw actuators may alternatively be possible.

Processing Vessel Assembly

The processing boat 12 is positioned so as to be within processing chamber 16 when processing is taking place. The processing chamber is becomes enclosed when the processing tube or jar 18 is moved downwardly and over the processing boat to cover the processing array. In FIG. 2 the processing tube assembly is shown moved partially downward into an intermediate position which is between its up and down positions.

Process tube or jar 18 is advantageously formed in a shape similar to a bell jar with a wall or shell 20 that has an inner surface which defines much of the perimeter of the processing chamber 16. The process jar also has an outer surface. The process jar is preferably made from quartz.

The lower reaches of the processing chamber are defined by portions of a base plate assembly 168. The processing jar 18 is mounted for vertical movement to allow the processing array to be opened into an open position for installation and removal of wafers, or to be closed into a closed position to form a substantially enclosed processing chamber used during thermal processing. When joined, the processing jar and base plate assembly form a substantially enclosed processing vessel. These parts are joined when the processing jar is lowered and placed in sealed relationship with the base plate assembly. The processing chamber 16 is contained and substantially enclosed within the processing vessel when the processing vessel is in such a closed condition.

Processing Tube Lift Assembly

Figure 4:
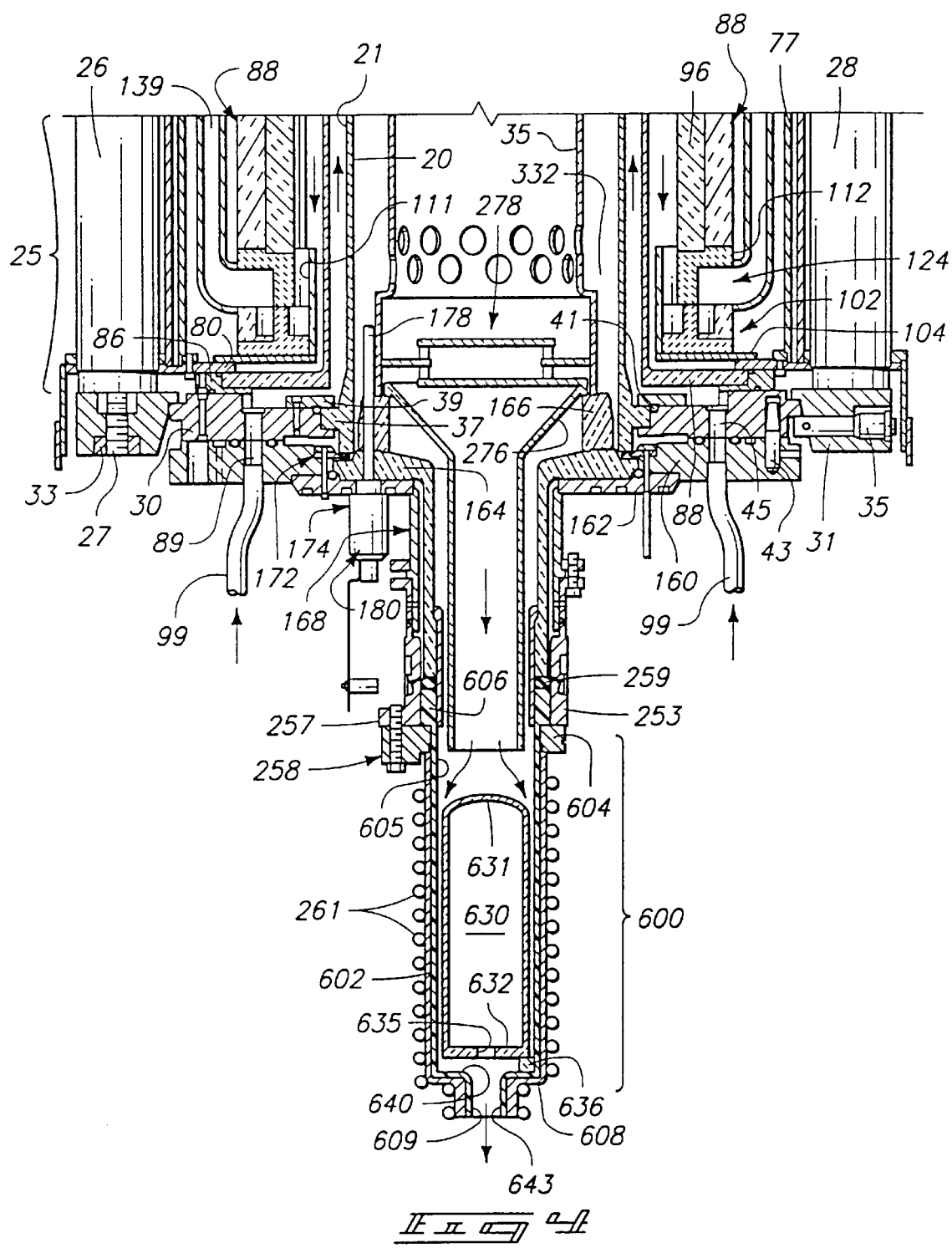
FIG. 4 is a sectional view showing a lower portion of the furnace heater assembly portion which complements the contents of FIG. 3.
Figure 5:
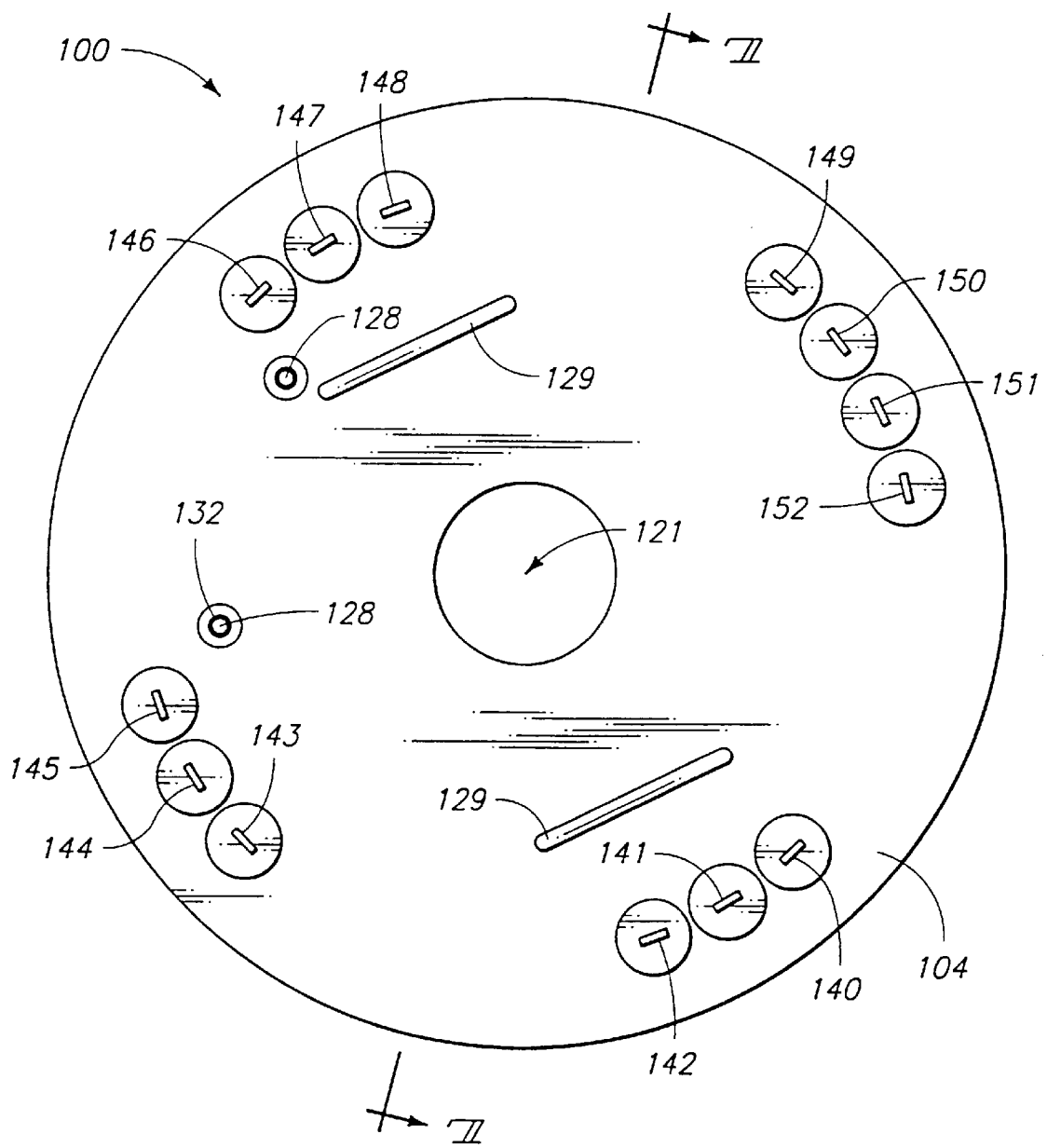
FIG. 5 is a plan view of a top of a heating enclosure subassembly forming part of the heater assembly shown in FIGS. 3 and 4.

The processing tube or jar 18 is supported upon a processing tube lift ring 30. Lift ring 30 forms part of a lift ring assembly which is movably mounted so as to allow vertical motion between up and down positions. FIGS. 4 and 10 show key portions of the lift ring assembly. The processing tube lift ring 30 is connected to and supported by a set of processing tube lift actuators 26. The upper ends and main portions of the lift actuators are secured to upper portions of a canister assembly 76 which is described in greater detail below. Lift actuators 26 also include extendible and retractable lift actuation rods 27. In the preferred construction there are three actuators each with actuation rods 27 which are controllably extendible relative to the main portion the actuators. Lift actuators 26 can be of various types. One preferred construction uses pneumatically powered rams. Alternative actuators, such as electrically powered mechanical screw actuators may alternatively be possible.

The distal, lower ends of actuation rods 27 are securely connected to lift ring 30. This is preferably done using an intermediary structure in the form of a peripheral or outer lift ring 31 (see FIG. 4). The actuation rods are preferably positioned through apertures in the outer lift ring and secured using detachable fasteners, such as threaded fasteners 33. The lift ring 30 is secured to the outer lift ring 31 to form a lift ring assembly using a plurality of detachable retainer pins 35 which engage these parts at several locations and are installed about the periphery of the outer lift ring 31. Although a two-part ring construction is shown for the lift ring assembly, other alternative constructions are possible.

FIG. 10 further shows that the processing tube 18 is provided with a bottom flange 37. Bottom flange 37 rests upon a shoulder formed along the inner periphery of a central aperture formed in the lift ring to receive the bottom portions of the processing tube. A flange retainer 39 bears upon the upper face of the processing tube flange. The flange retainer is connected by retainer fasteners 40 to the lift ring 30 to detachably secure the processing tube to the lift ring assembly. A flange seal 41 is advantageously included between the flange 37, flange retainer 39, and lift ring 30. Additional seals or pads (not illustrated) can also advantageously be included between the upper and lower faces of the flange and the adjacent ring 30 or retainer 39.

FIG. 10 also shows that the lift ring assembly is advantageously provided with one or more locator pin receptacles 47. Receptacles 47 receive locator pins 43 which are secured in the upper face of the base plate main piece 160 using locator pin keepers 648. The locator pins cause the lift ring assembly to align and be mated with the base plate assembly in precise horizontal registration when the lift ring assembly is lowered into the down position.

FIG. 10 further shows that lift ring 30 is provided with a plurality of cooling fluid ports 45 which are formed at numerous positions about the lift ring to form a circular array, such as containing 20–30 ports. The passageways 45 allow a circumferentially distributed supply of cooling air to pass therethrough as part of a first fluid cooling circuit which will be described in greater detail below. Adjacent to the passageways is an annular distribution groove or channel 46 which allows cooling gas to be distributed to the individual passageways 45 about the channel. Channel 46 is in fluid communication with a cooling fluid passageway 89 in the base plate main member 160. Heat is transferred to the air or other cooling fluid from the adjacent mounting ring 30 and the area near processing tube bottom flange 37. This construction helps to cool adjacent portions of the processing tube 18 and its supporting lift ring assembly. The cooling fluid also proceeds upward to cool other parts of the processing tube.

Furnace Heater Assembly Canister

Figure 3:
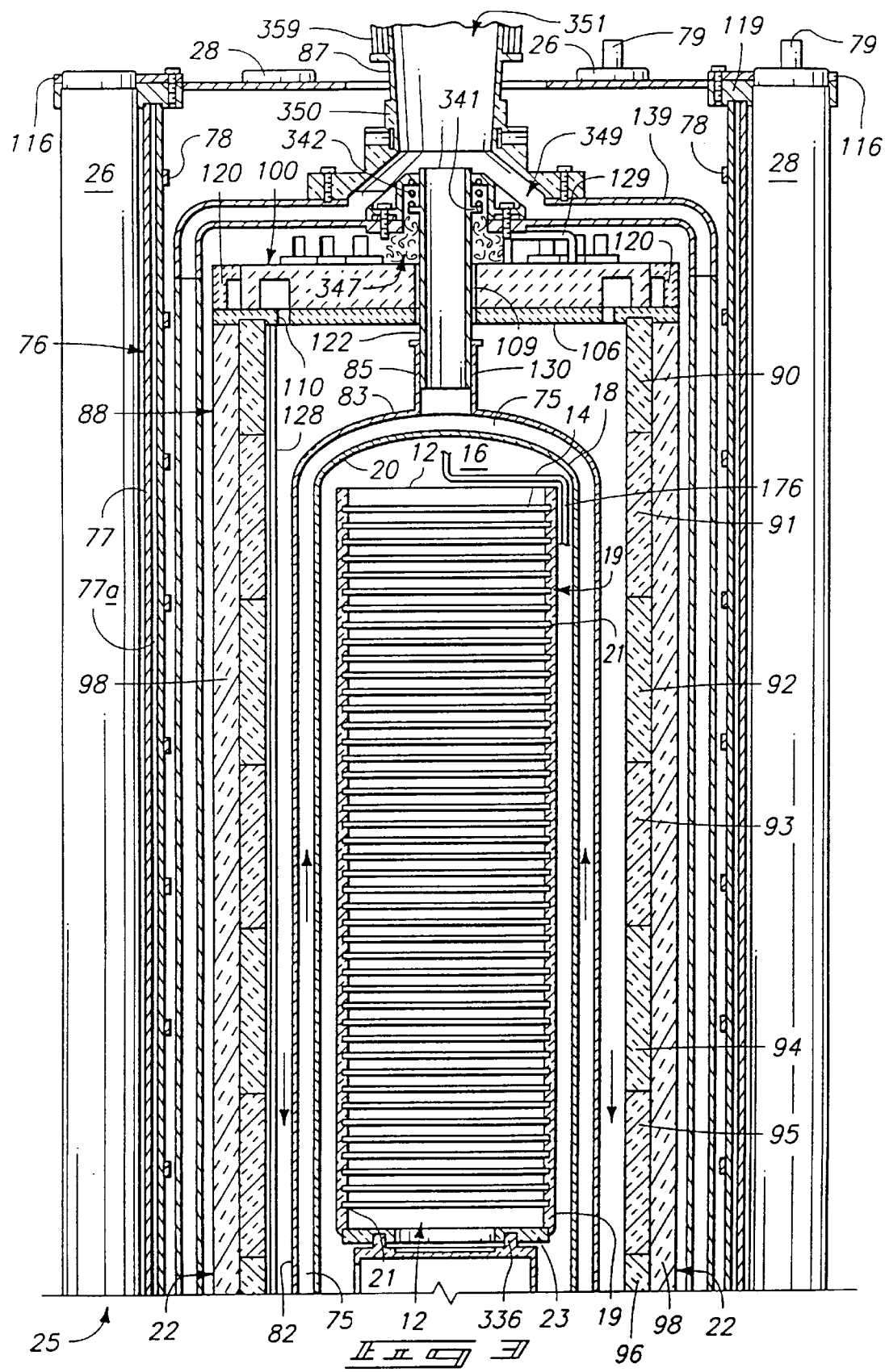
FIG. 3 is a sectional view showing an upper portion of a furnace heater assembly portion forming part of the thermal processor of FIG. 1.

FIGS. 2, 3 and 4 show the furnace heater assembly 22. As FIG. 2 indicates, the furnace heater assembly is part of the head assembly and is mounted above the processing boat 12 and processing tube 18. Furnace heater 22 is preferably mounted for vertical motion in a manner which parallels the motion of the processing tube lift assembly described above. Both the furnace heater assembly and processing tube assembly are moved upwardly when the processing boat 12 is being loaded. FIG. 2 shows the furnace heater positioned fully upward into a retracted or up position. Prior to processing, the processing tube assembly and furnace heater assembly are moved downwardly. The furnace heater is moved into an extended or down position wherein the heater assembly surrounds most of the processing tube 18 and supplies heat to the processing tube and the processing chamber enclosed therein.

In the preferred construction shown, the heater assembly can be raised and lowered independently from the processing tube assembly, once the processing tube assembly has been lowered into the down position.

The outer portions of furnace heater assembly 22 includes a protective canister 76. The preferred canister 76 includes a side wall or walls 77. As shown best in FIGS. 3 and 4, the side wall is preferably made using a double wall construction with a canister cooling system formed therein. The preferred canister cooling system includes a water jacket space 77a contained between the inner and outer canister walls 77. Water is circulated through the canister water jacket space to cool the canister and its surfaces against the high temperatures generated in the furnace heater by the heating enclosure subassembly described below. Water can be circulated through space 77a via fittings (not shown) using a pressurized water supply (not shown).

The canister also preferably includes a series of lateral wall reinforcing rings 78. Reinforcing rings 78 extend circumferentially about the inner side wall of the canister for added structural support.

Canister 76 further includes a canister top ring 119 which is fastened to the top portions of side wall 77. The canister top ring 119 is used to mount an upper actuator mounting ring 116. The actuator mounting ring 116 is used to mount the upper ends of actuators 26 and 28.

FIG. 4 shows that canister 76 also includes a bottom flange ring 80 fastened to a bottom edge of the canister assembly. Bottom flange 80 is used to mount the lower ends of actuators 26 and 28. Flange 80 is also used to mount a peripheral heat shield 32 which extends about the bottom circumference of the canister assembly to shield heat radiated from the outer lift ring 31 and adjacent parts of the head and base plate assemblies.

The top plate, top ring, flange ring, side wall, heat shield and other parts of the canister assembly are advantageously made from stainless steel or other suitable materials.

Heating Enclosure Subassembly

FIGS. 3 and 4 further show that the furnace heater assembly 22 includes a heating enclosure subassembly 88 which heats and insulates the processing vessel and processing chamber during processing. The heating enclosure subassembly 88 is mounted within canister 76. The canister assembly, heating enclosure subassembly, and heater liner 82 together form the principal components of the heater assembly 22.

The heating enclosure subassembly includes a plurality of segments which are assembled together to form a heating enclosure wall or walls. In the preferred construction, the segments include a plurality of circumferential segments 90–96, end segment 100, and a base segment 102. Electrical resistance heating elements are advantageously included in the circumferential segments 90–96 and in the end segment 100. End segment 100 and base segment 102 are specially constructed to provide for the passage of cooling fluid therethrough in a manner which reduces radiant heat loss from the interior chamber of the heating or furnace enclosure.

Segments 90–96 and 100 include both an electrical resistance heating element and surrounding insulatory and structural materials. The electrical resistance heating elements 101 are positioned along the interior face of the segments and formed in a sinuous pattern, such as shown for the top heating element 101 of FIG. 6. Heating elements 101 are preferably formed from a powdered metallurgical material having desired electrical resistance properties. The preferred electrical resistance heating elements include a powdered metallurgical mixture including chromium, aluminum, iron, and yttrium. The proportions of these materials can vary as is known in the art of producing such powdered metallurgical electrical resistance heating elements. The heating elements are shaped into convoluted patterns which preferably provide a heat flux density of approximately 20–30 watts per square inch of effective heating surface along the interior surface of the heating element segments 90–96 and 101. Even more preferably the heat flux density is about 28 watts per square inch. The preferred heating elements can have a conductive element having a diameter of approximately 2–3 millimeters, more preferably 2.2 millimeters.

The electrical resistance heating elements are preferably trained into a serpentine pattern to provide relatively uniform heat flux from the inner surface of the segment. Each element is advantageously affixed to each segment by a plurality of retaining clips (not shown) that are secured to the inner surface with fasteners.

The heating enclosure segments 90–96, 101 and 102 preferably include ceramic fiber materials which can be suitably molded or otherwise shaped to the desired shapes. More preferably, the ceramic fiber materials can be made of approximately 50% alumina fibers and 50% silica fibers. Other formulations and types of materials may also be satisfactory.

The circumferential heating element segments 90–96 are arranged into a longitudinal heating element array with adjacent elements in longitudinal juxtaposition. The array of heating element segments is surrounded by a secondary insulation layer 98. Secondary layer 98 is formed of a highly insulatory material, such as fibered ceramic material indicated above or other types of ceramic fibers which are matted together to form a relatively less dense layer having good thermal insulation properties. The secondary layer 98 is preferably a continuous layer formed about the exterior of segments 90–96. The outer surface of insulatory layer 98 is advantageously encased in a protective jacket or skin 103 of stainless steel sheet metal or other suitable materials that can be welded or otherwise joined to adjacent parts of the heating enclosure assembly along mating surfaces.

FIGS. 6 and 7 show the preferred construction for end segment 100 in greater detail. End segment 100 is secured to the top of the array of circumferential segments 90–96, such as by using a suitable bonding agent which bonds the segments together, and/or by securing them together with the protective jacket 103. As shown, the lower face 104 of segment 100 is provided with an annular recess 105 which receives the upper portion of the adjacent circumferential segment 90.

FIG. 6 also shows heating element 101 which is mounted upon the inside face of the end segment. The end heating element is used to provide uniform heating and added control relative to wafers supported by the upper portions of the processing boat 12. Other aspects of the heating element are described above.

FIGS. 6 and 7 indicate that end segment 100 is preferably fabricated using three pieces of the molded ceramic fiber material, such as described above. The three piece assembly includes a first or interior piece 106, a second or main piece 107, and a third or outside piece 108. These pieces are specially configured to form a plurality of cooling fluid passageways 143 formed therein. The cooling fluid passageways 143 form part of the second fluid circuit described further below.

The first or interior piece 106 is adjacent the furnace heating chamber and mounts the heating element 101. Interior piece 106 includes a plurality of interior ports 110 which are in direct fluid communication with the interior chamber of the heating enclosure subassembly. As shown, there are thirty two ports 110 which are arranged in a circular cooling fluid port array at approximately equal radial positions and at approximately regularly spaced angular positions. The ports are positioned radially so as to be near but inward a short distance from the interior surface defined by the heating element segments 90–96. It is alternatively possible to use other configurations and spacing for ports 110.

FIGS. 6 and 7 also include a second piece 108 which forms part of end segment 100. The lower face of second piece 108 includes an annular inner manifold chamber 113. The inner manifold chamber is in fluid communication with the internal ports 110. Outwardly adjacent to the inner manifold chamber 113 is a series of manifold connecting passages 114. The manifold connecting passages are defined by a plurality of manifold chamber shields 115. The manifold chamber shields 115 are formed as downward extensions of the second piece 108 as illustrated in FIG. 7. Outwardly from passages 114 and shields 115 is an annular outer manifold chamber 116. Outer manifold chamber 116 is in fluid communication with passages 114 and a suitable number of exterior ports 120. Exterior ports 120 are in fluid communication with the space which is outside of the heating element assembly 88. Exterior ports 120 can extend out the side as shown, or alternatively out the top of the heater enclosure (not shown).

The construction just described provides a convoluted flow passageway which substantially reduces radiant heat losses which occur as compared to having a straight port arrangement. The shields 115 are in coordinated proximity to the ports 110 to reflect radiant energy beamed through ports 110 from the furnace heating chamber. The passages also temper the air to some degree before entry into the heating chamber.

The heating elements 90–96 and 101 are electrically connected to a power supply system via heating element connection terminals 140–152 and associated wiring (not shown). The preferred power supply system is described below in greater detail. End segment 100 can also be optionally provided with handles 129.

The end segment 100 is also provided with end segment central apertures 109. Central apertures 109 allow a first cooling circuit connection conduit 122 to extend therethrough and mate with a first cooling circuit connection fitting 85 formed upon the furnace liner 82.

The heating enclosure subassembly 88 also includes a heater base 102 which is shown in isolation in FIGS. 8 and 9. Base 102 is affixed to the bottom of the assembled stack of heating element segments 90–96. The preferred base shown is advantageously constructed by assembling four parts. As shown, base 102 is formed by joining together a first part 123, a second part 125, a third part 127, and a fourth part 129. These parts are preferably molded or otherwise formed prior to assembly and thereafter joined together in a suitable fashion such as by bonding with a suitable bonding agent for the type of insulatory material used. In the preferred form these parts are molded from ceramic fiber materials as explained above. Alternative constructions are also possible.

The first part 123 includes an annular recess groove 133 which receives the lower edge of the bottom segment 96. The bottom segment can be bonded or mechanically retained in the groove 133 in a fashion similar to the joint between the top segment 90 and groove 105.

The first part 123 and fourth part 129 define a plurality of cooling fluid interior ports 111 formed through the base in a suitable fashion. As shown, ports 111 are in a circular array open along the top face of the base and preferably at regularly spaced angular positions about the central opening 123. As shown, there are thirty two ports 111 at equiangularly spaced positions. Ports 111 form parts of a second cooling circuit which will be more fully described below. Ports 111 are preferably in fluid communication with the interior chamber of the furnace heater and in fluid communication with an annular inner manifold chamber 126 positioned beneath the ports. FIG. 8 shows a series of manifold connecting passages 134. The manifold connecting passages are defined by a plurality of manifold chamber shields 135. The manifold chamber shields 135 are formed as upward extensions of the third part 127. Outwardly from passages 134 and shields 135 is an annular outer manifold chamber 137. Outer manifold chamber 137 is in fluid communication with passages 134 and a suitable number of exterior ports 124. Exterior ports 124 are in fluid communication with riser ducts 139 shown in FIGS. 4 and 10.

The construction just described provides a convoluted flow passageway which substantially reduces radiant heat losses which occur as compared to having a straight port arrangement. The shields 135 are in coordinated proximity to the ports 111 to reflect radiant energy beamed through ports 111 from the furnace heating chamber. This construction also allows cooling fluid to be passed through passageways 111, 126, 134, 137, ports 124 and riser ducts 139 as part of the second fluid circuit described more fully below.

Base 102 also includes a central opening 141 within which is received furnace liner 82 and processing jar 18. The heating enclosure subassembly is preferably mounted in coaxial alignment within the canister 76 by using a heating enclosure bottom ring 104 that is connected to the bottom of base 102. The bottom ring is fastened or otherwise suitably attached to the canister flange ring 80. FIGS. 8 and 9 show that most preferably, the positioning ring 104 is formed from a piece of metal having an inner edge which is connected to the base. Fasteners extend through receiving holes formed through the ring and mounting blocks and are threaded into complementary receptacles formed in the canister flange ring 80.

Furnace Heater Liner

As best shown in FIGS. 3, 4 and 10, a furnace liner 82 is included along the inside of the heating enclosure assembly 88. The liner 82 forms an inner wall of the furnace heater. The liner is preferably constructed in a shape and size which is complementary to the processing tube 18. As shown, the inner surface of the liner is spaced apart in approximately coaxial relationship with an outer surface of the process tube 18. The furnace liner is also shaped in a bell jar shape which is larger but similar to the bell jar shape of the processing tube 18.

Furnace liner 82 further has a bottom opening that allows the liner to pass over the processing tube 18 as the furnace heater assembly is lowered thereover. The lower end of the furnace liner also flares outwardly to provide a mounting flange 84. The furnace liner 82 is mounted to remaining portions of the furnace heater assembly and held in centered coaxial alignment within the interior of the furnace. This is advantageously accomplished by capturing the mounting flange 84 between the canister flange ring 80 and a liner mounting ring 86. The liner mounting ring is brought into engagement with a bottom face of the canister flange ring, thereafter the liner mounting ring is secured to the canister flange ring by a plurality of fasteners. A first liner seal is provided along the peripheral edge of the flange 84. A liner face seal 138 is provided between the lower face of mounting ring 86 to seal against the upper face of the lift ring 30 forming part of the processing tube assembly.

FIG. 3 shows that the top end of liner 82 preferably includes a liner dome 83. Centrally located on the dome is an first cooling circuit connection fitting 85 which is preferably integrally formed with remaining portions of the dome. A first cooling circuit connection conduit 122 seals with fitting 85 to form part of the first fluid cooling circuit.

The furnace liner 82 is preferably constructed of quartz and is most preferably fabricated as a singular piece having the features described above.

Furnace Sensors

A plurality of temperature sensors, such as thermocouples, are mounted in the furnace 22 in order to provide an indication of the temperatures being developed by the heating elements contained in segments 90–96 and 101. As shown, there are two groups of spike temperature sensors which are provided as temperature sensor arrays 128. The spike thermocouple arrays are positioned in the cavity adjacent to the heating elements, which is between the heating enclosure subassembly 88 and the furnace liner 82. The spike thermocouple arrays 128 are mounted through sensor mounting apertures 132 formed through end assembly 100. The lower ends of sensor arrays 128 are supported in base 102 at sensor receptacles 136.

Additional profile temperature sensors are mounted upon the base plate assembly 168 and such are described below in connection with the description of that assembly.

Base Plate Assembly

The thermal processor 10 also includes a base plate assembly 168 which is supported upon portions of the stationary framework 24. The base plate assembly remains in a stationary position throughout processing. The base plate assembly supports a pedestal assembly 163 which in turn supports the processing boat 12 and any wafers 14 held thereon. The preferred construction of the pedestal assembly 163 is considered below after the base plate assembly 168 is described.

FIG. 10 shows that the base plate assembly is preferably constructed using three principal pieces. One principal component is a main base plate member 160 which is secured to and supported upon the frame 24. Main base plate member 160 is provided with a plurality of mounting apertures 216 which are used to secure the member to the frame 24.

A second principal part is the base support member 162 which is connected to the underside of main base plate member 160 using fasteners 161. A dowel pin 183 can be used at one or more points to assure accurate positioning of the member 162 relative to main base plate member 160.

The support member 162 is positioned beneath the third principal piece which is a base throat piece 164 which is supported thereon. The base throat piece 164 is supported laterally by the inner edge of the main base plate 160.

The main base plate 160 and support member 162 are preferably made of stainless steel and serve important functions as structural members. The base throat piece 164 is exposed to high temperatures and processing gases contained within the processing chamber 16. Because of such service, the base throat piece 164 is preferably made from quartz or other suitable material which is capable of high temperatures. The throat piece 164 also must perform without off-gassing undesirable constituents or otherwise reacting in the severe environment of the processing chamber. The base throat piece 164 also serves to shield the main base plate 160 and support member 162 from exposure to the processing gases contained within the processing chamber. This arrangement has the advantage that substantially the entire surface of the base plate assembly which is in adjoining fluid communication with the processing chamber 16 is formed from quartz material, thereby eliminating potential adverse effects of off-gassing from metal components which might contaminate the processing chamber 16.

Another important part connected to the base plate assembly is a main processing chamber seal 172. In the construction shown, the main processing chamber seal 172 is supported upon the base throat piece 164. Main processing chamber seal 172 seals between the quartz throat piece 164 and the bottom end of processing tube 18. The placement of the seal between these parts provides almost total quartz material being used to confine the lower portions of the processing chamber.

The base plate assembly is provided with features designed to cool the main seal 172. A main seal cooling gas distribution system is provided to provide cooling gas, such as air or nitrogen, at ambient temperatures to the seal area. The main seal cooling gas distribution system is described more fully below after first considering some addition features and construction of the base plate assembly.

The main base plate member 160 is provided with a number of features which allow for sealing and delivery or passage of fluids. One key feature is a pair of circular upper face seals 203. Face seals 203 can advantageously be made of Viton elastomer. Face seals 203 extend about the greater diameter of the upper face of the main base plate member 160 to define an annular sealed area against the lower face of the vertically movable processing tube assembly. When the processing tube assembly moves downwardly, then seals 203 are engaged by the lower face of processing tube lift ring 30. The annular sealed area between seals 203 is used to seal annular channel 46 formed in the lower face of lift ring 30. Cooling fluid passing through the first cooling circuit is supplied to the annular channel 46 via a first cooling fluid supply passage 89 formed through main base plate member 160. Supply passage 89 is advantageously connected to a supply fitting or tube 99 which extends below the main base plate member and is connected to a suitable source of cooling fluid.

Main base plate member 160 is also preferably provided with a cooling system in the form of an annular coolant channel 208. Channel 208 is formed in the upper face of the main base plate member. It is provided with a coolant channel cover piece (not shown due to scale of drawing) which serves to contain water or other suitable coolant within the channel. The channel and cover are preferably constructed so that a fluid path is formed which extends substantially around the entire circumference, but not entirely around. This is most advantageously accomplished by forming channel 208 most of the way about the circumference, but by leaving a small dam (not shown) across the channel. Coolant is then introduced into the channel on one side of the dam and then circulated around the channel to flow out of the channel on the other side of the dam. Coolant is supplied to channel 208 in any suitable fashion, such as by connecting passages 207 shown schematically in FIG. 10.

Figure 12:
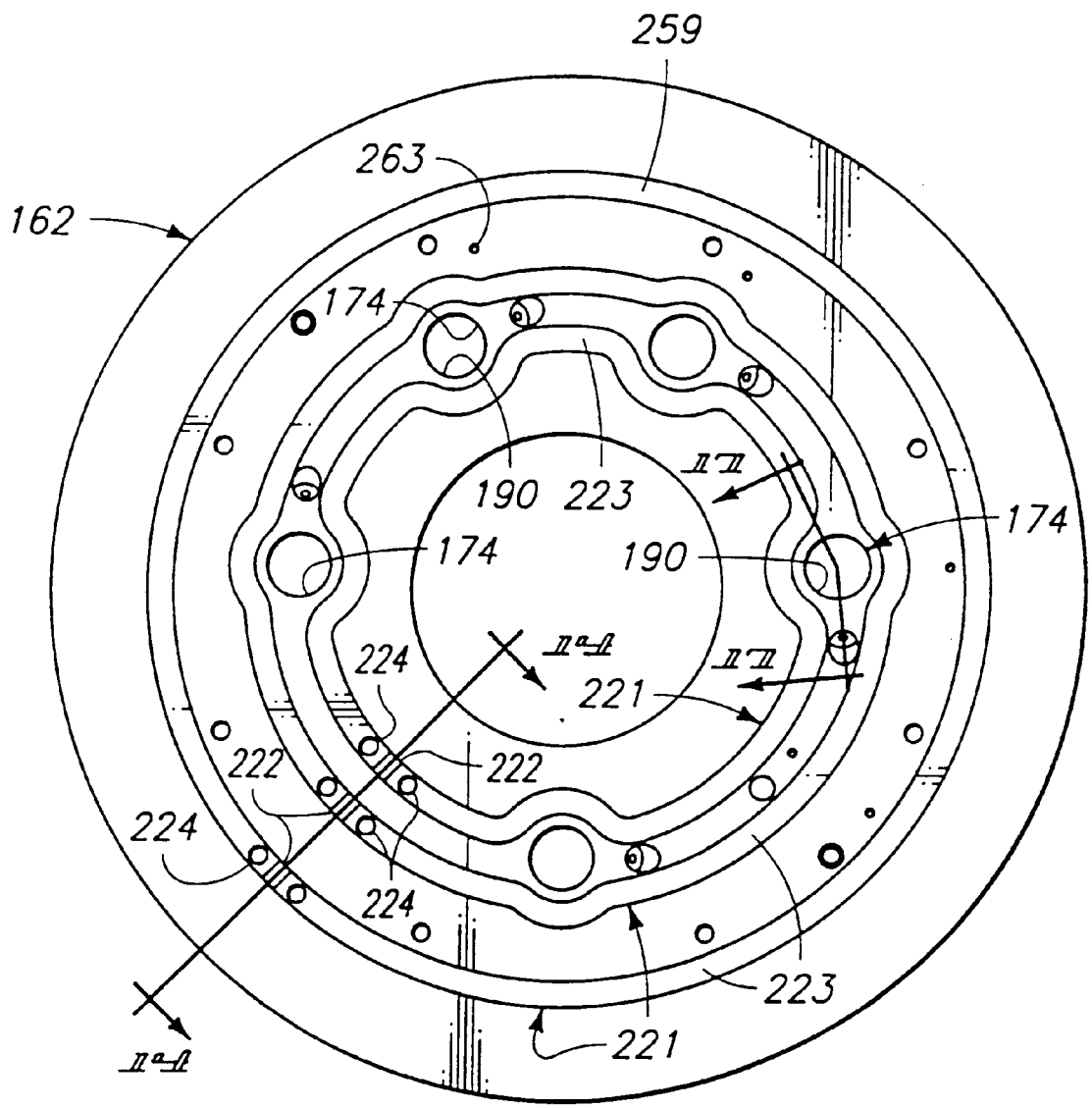
FIG. 12 is a bottom view of the base support portion shown in FIG. 11.

A similar cooling arrangement is also used to cool the base support piece 162. FIG. 12 shows in greater detail a series of three parallel annular coolant channels 221. Channels 221 have channel covers 223 which cover the channels and allow them to serve as substantially enclosed coolant passageways. FIG. 14 shows that along section line 14—14 there are dams 222. Dams 222 can either be part of the basic structure of piece 162 or inserts. Coolant is introduced into a port 224 and flows about the channel to flow from the complementary port 224 on the opposite side of dams 222. This arrangement allows large amounts of heat to be removed from the support piece 162 by circulating water or other suitable coolant through the channels.

Figure 10A:
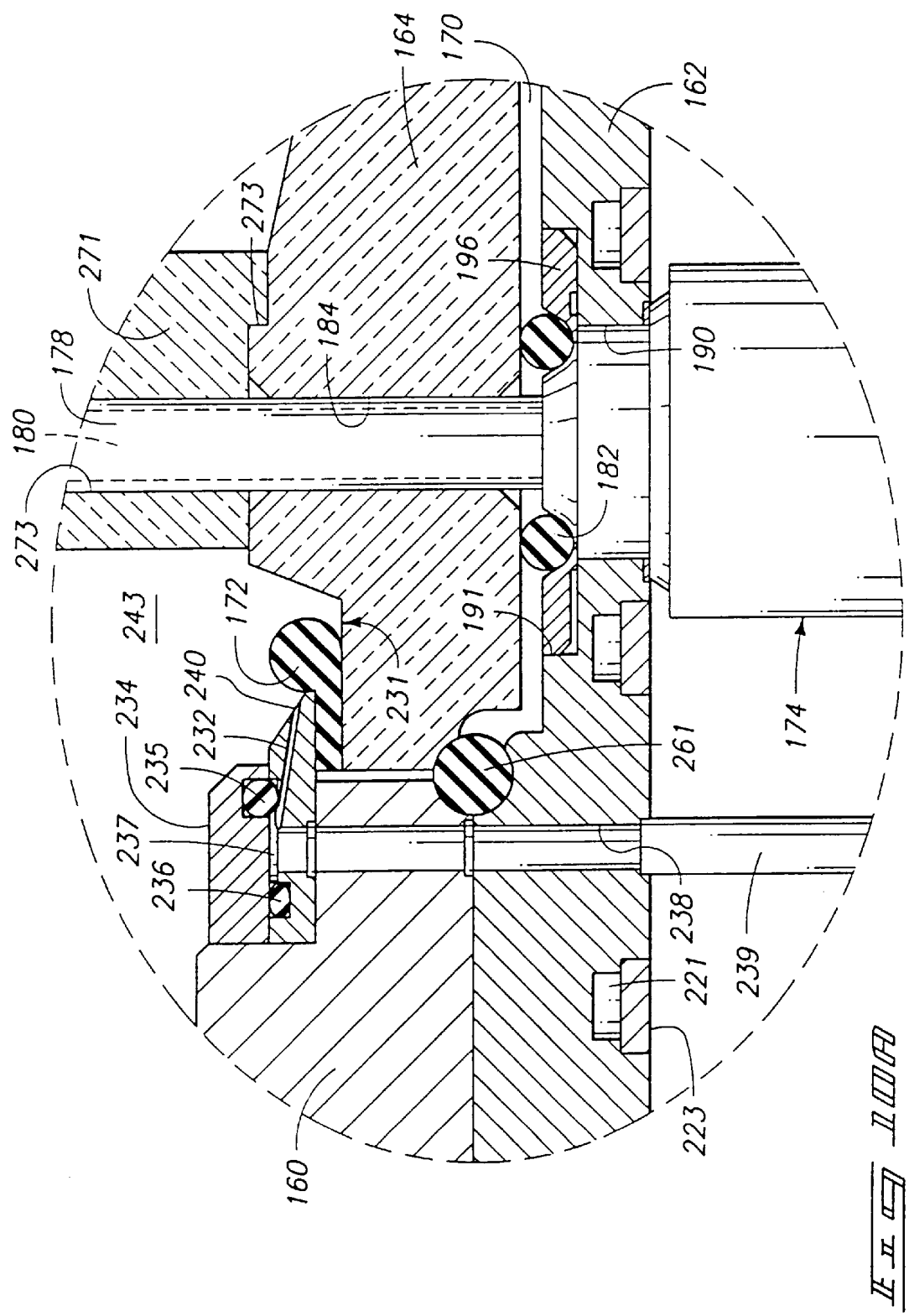
FIG. 10A is an enlarged detail sectional view taken from the encircled region of FIG. 10.

The support piece 162 and main base plate member 160 also are adapted to provide a cooling flow of air, nitrogen or other suitable coolant fluid to the main processing chamber seal 172. This is preferably done in a construction which distributes the cooling air about the entire annular seal. FIG. 10A shows the preferred construction in enlarged cross-section detail. Seal 172 is advantageously a P-shaped seal when viewed in cross-section. The high temperature service requires a suitable high temperature seal material to be used. A preferred material is DuPont Kalrez, although other high temperature seal materials are alternatively possible.

FIG. 10A shows that seal 172 is securely mounted upon the upper surface of the quartz throat piece 164. This is advantageously done along a peripheral recessed shoulder 231 of throat piece 164. A seal retainer 232 bears upon a flange portion of the P-shaped seal 172 to retain the seal in position. Retainer 232 is secured to the main base plate piece 160 using fasteners (not shown) which extend through the overlying retainer cap piece 234. Between the retainer 232 and retainer cap piece 234 are two additional seals 235 and 236 which seal between these parts. An annular flow distribution space 237 is defined between the seals 235 and 236 and between the retainer and retainer cap. Air, nitrogen, or other suitable cooling fluid is supplied to the flow distribution space 237 via a coolant supply passageway 238. A coolant supply line 239 supplies coolant to the passageway and distribution space 237. Retainer 232 is provided with coolant release ports 240 which communicate the coolant from distribution space 237 toward the seal 172. The coolant flowing from ports 240 is preferably directed at the seal and then flows about the seal to reduce the temperature of the seal. The coolant then flows about an annular main seal space 243 and is passed through a main seal coolant outflow passageway 244 and associated coolant outflow conduit 245.

The support piece 162 is also preferably provided with a means for mounting a plurality of attachments or accessories which extend into the process chamber 16. The embodiment shown has been provided with five separate accessory fittings 174. Accessory fittings 174 are constructed similarly but can be used for various purposes. One or more of fittings are used to mount a gas delivery tube 176 (partially shown in FIG. 3) which has an open discharge end near the top of the processing chamber and extends down along the side of the processing boat 12. Tube 176 allows various processing chemicals to be introduced into the process chamber. Another regular use of one or more of fittings 174 is to mount one or more profile thermocouple arrays 180. The preferred profile temperature sensor arrays 180 extend upwardly into the processing chamber 16 between the processing tube 18 and the wafer boat 12. Preferably, the gas delivery tube 176 is formed from quartz or other suitable material for the processing environment being encountered. Similarly, each profile thermocouple array 180 is preferably sealed within a quartz thermocouple tube 178 along the entire length exposed to the process chamber 16. It is alternatively possible to use fittings 174 to mount other attachments or accessories in addition to the common ones explained above.

Figure 11:
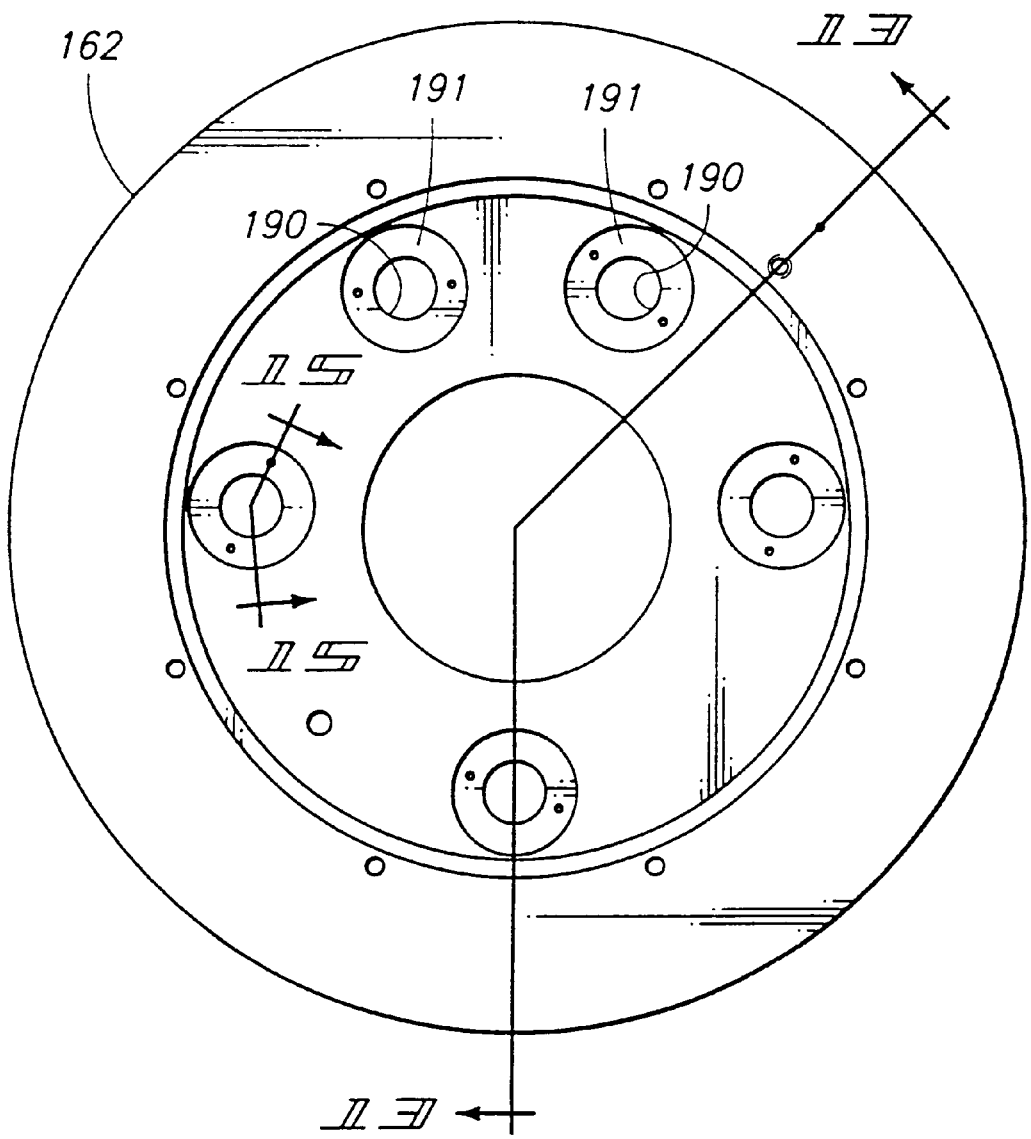
FIG. 11 is a top plan view of a base support portion forming part of the base plate assembly shown in FIG. 10.

Because of the high temperatures encountered, it is desirable to include a means for cooling where the fittings 174 receive the accessories mounted therein. This is desirable in order to cool the seals used about the fitting and prevent premature failure of the seals or other components of the accessory being mounted. FIG. 10A shows in detail, an O-ring seal 182 which is placed around each fitting 174 at a location so it becomes trapped between the base piece 164 and the support 162 when assembled together. As shown in FIG. 10A, a port 184 is formed in the base throat piece 164 in order to allow placement of the thermocouple array 180 (or delivery tube 176 not shown in FIG. 10A) therethrough and into the process chamber 18. Likewise, a support port 190 is formed in the base support 162 through which the end of fitting 174 are similarly received as illustrated in FIGS. 10A and 11. In this construction, O-ring 182 serves to form a circumferential seal between the base throat piece, base support piece and fitting which seals the fluid cooling cavity 170 from ports 184 and 190.

The ports 190 have recessed regions 191 along the upper surface of piece 162 as shown in FIGS. 10A and 11. The recessed regions allow a cooling feature to be installed adjacent to each O-ring 182. The preferred cooling feature is in the form of a cooling air distribution disk 196.

Figure 17:
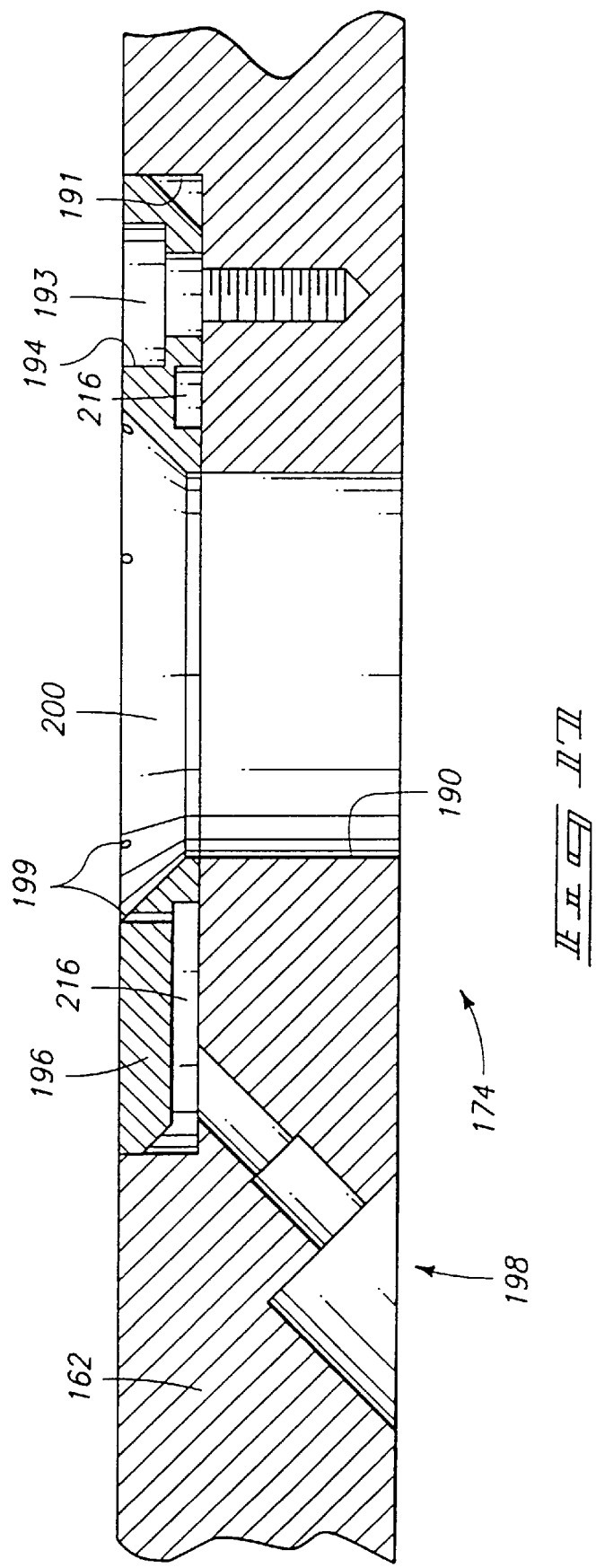
FIG. 17 is a sectional view taken along the line 17—17 of FIG. 12. The cutting plane of FIG. 17 is also shown in FIG. 16 with regard to how it cuts through the air distribution disk.
Figure 18:
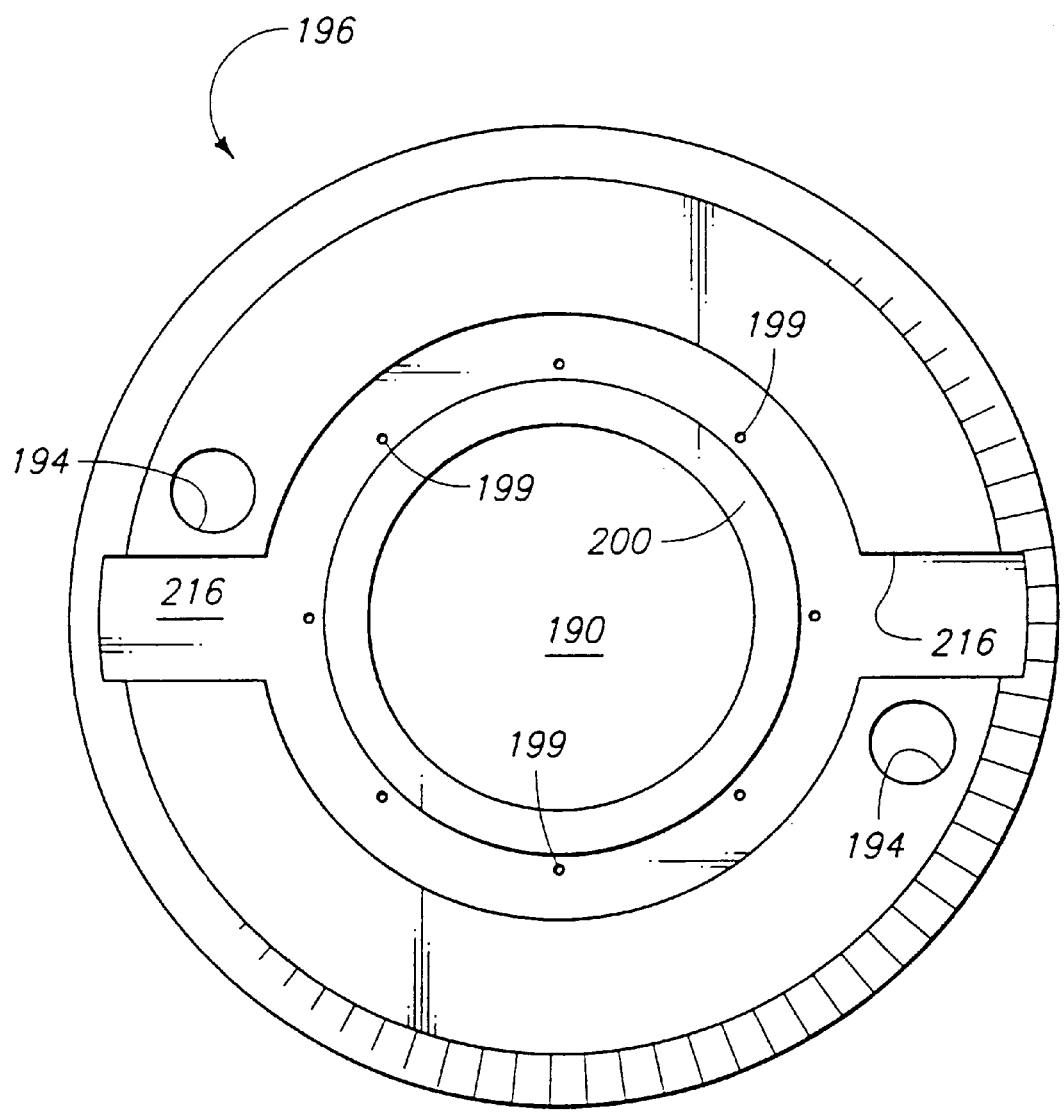
FIG. 18 is a bottom view of the air distribution disk shown in FIG. 16.
Figure 19:
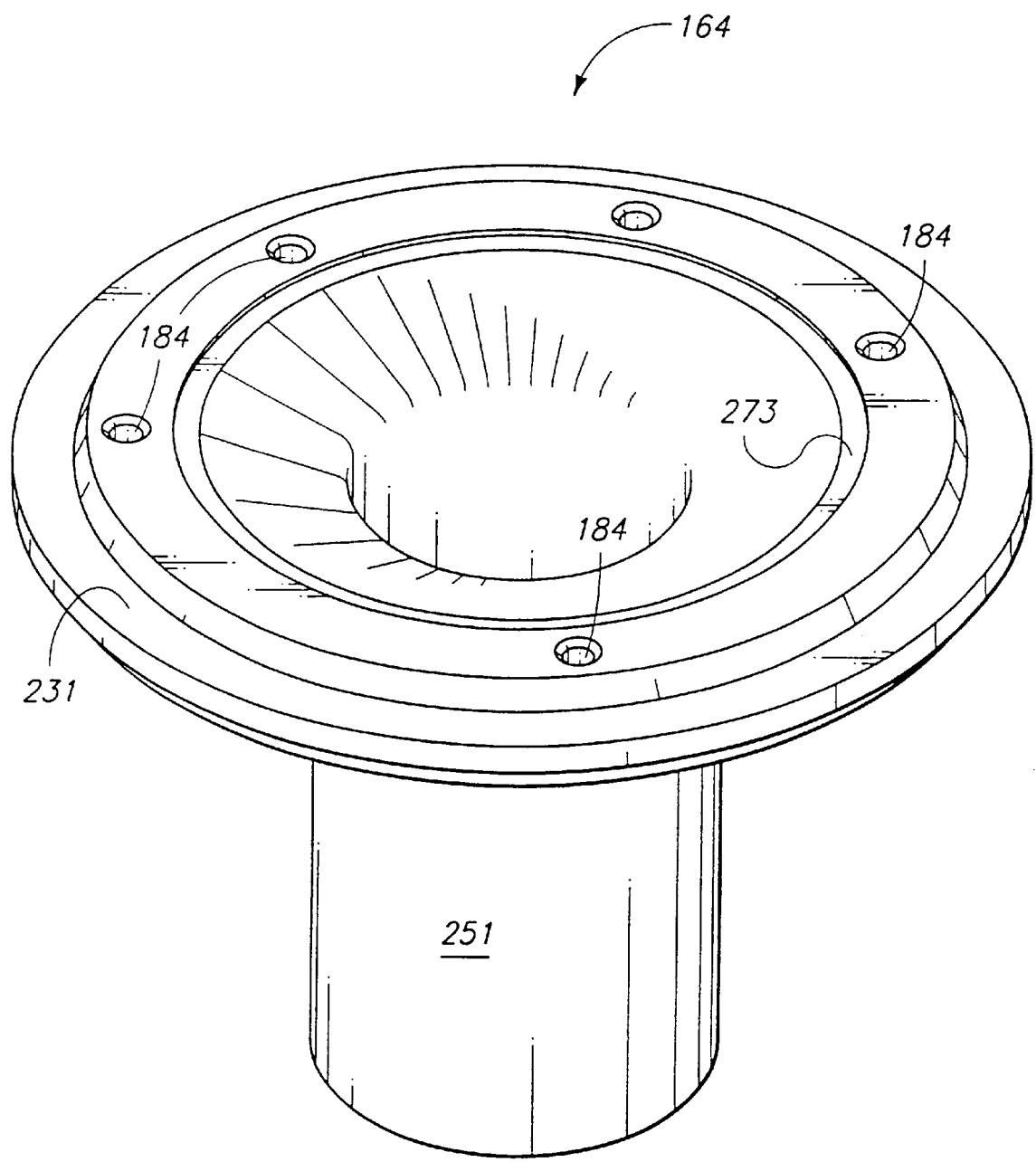
FIG. 19 is a perspective view of portions of the base plate assembly shown in FIG. 10.

FIGS. 16–18 show details of the cooling feature in enlarged detail. As FIG. 17 shows, each port 190 is provided with the adjacent recessed region 191 which forms a seat. Disk 196 is mounted in the recessed region 191 and is secured thereto using fasteners 193 (FIG. 17) which extend through apertures 194 formed through the disk 196 and into base support piece 162 at each port. Disk 196 also has a central aperture 201 through which the thermocouple array 180 or gas supply tube 176 extend up and into the processing chamber.

A cooling supply port 198 extends through base support 162 to provide fluid communication of cooling air, nitrogen or other fluid to the recessed area 191 for distribution within an annular distribution cavity 216. Cavity 216 is in fluid communication with exhaust ports 199 which supply cooling fluid to the space adjacent to O-ring 182. Supply ports 198 can be threaded to facilitate connection of supply lines (not shown) thereto. FIG. 17 also shows that disk 196 has a beveled O-ring seat 200 that acts to position and compressively seat the O-ring seal 182 between the base plate 162, disk 196, and accessory 176 or 180.

FIGS. 10 and 10A also show a base cooling cavity 170 between the base piece 164 and the base support member 162. FIG. 10 shows that cavity 170 is further defined by an exit duct 251 which is connected securely within the central aperture of base support member 162. The exit duct 251 is provided with a flange 252 which is used to mount an exit duct end piece 253 using fasteners 254. The exit duct 251, exit duct end piece 253, base piece 164, and base support member 162 enclose the base cooling cavity 170. A seal 261 (FIG. 10A) seals between the members 162 and 164 at the outer perimeter of the base cooling cavity 170. A seal 269 (FIG. 10) seals between the parts 251 and 253.

The exit duct end piece 253 is provided with one or more cooling gas ports 262 which supply nitrogen, air or other suitable cooling fluid to the base cooling cavity 170. As shown the cooling gas ports 262 are includes at plural locations about the circumference and cooling fluid is distributed to each port within an annular distribution channel 263 covered by a cover 264. Cooling fluid supplied through ports 262 is passed through cavity 170 and exits through a number of exhaust holes 263 (see FIG. 12) formed in the base support member 162.

The exit duct end piece 253 also has a cooling channel 255 similar to the cooling channels 222 described above. Cooling channel 255 includes a cooling channel cover 256. Cooling water or other suitable fluid is passed about the circumferential cooling channel to cool the exit duct end piece 253.

The exit duct end piece 253 is also advantageously provided with a exit duct bottom flange 257. The exit duct bottom flange 257 mounts a plurality of J-hook fasteners 258 which are used to mount piping, or more preferably the outflow cooler 600 described below. The piping or cooler are sealed against the bottom end surface of the base member 164 using an outflow main seal 259. The outflow is also preferably provided with an outflow seal heat shield 607 (FIG. 10) which reduces heat to the seal and allows the cooling jets 262 to maintain lower temperatures for seal 259. The heat shield 607 has a support lip which is advantageously supported upon a ledge formed along the inner diameter of the base piece 164.

Pedestal Assembly

FIGS. 3, 4 and 10 also show that the thermal processor 10 is preferably provided with a pedestal assembly 163. Pedestal assembly 163 includes a pedestal collar 271 which rests upon the quartz base throat piece 164. Collar 271 is provided with accessory apertures 272 (FIG. 10A) as needed to allow extension from fittings 174 up into the processing chamber. The collar preferably rests partially within a recessed area defined by shoulder 273 (FIG. 10A) along the upper face of base throat piece 164 to help maintain proper positioning of the collar thereon.

The pedestal collar 271 supports a pedestal cylinder 281 which is affixed sets upon a recessed end area of the collar. The pedestal cylinder extends upwardly and supports a pedestal headpiece 283. Headpiece 283 preferably has a plurality of pedestal holes 284 which allow gases which are exhausting from the processing chamber to pass therethrough. The upper end surface of the headpiece is advantageously provided with locating features for maintaining the proper position of the processing boat 12 thereon. As shown, the locating features include a pair of locating projections 336. The end surface can also include a central recessed area 286 which further serves as a locating feature. The central recessed area 286 can alternatively be an aperture extending through the end surface to further facilitate circulation of gases within the pedestal.

The pedestal collar 271 is preferably made of opaque quartz as is the pedestal cylinder 281. The pedestal headpiece is preferably made from silicon carbide. Both are formed using well-known production techniques for these materials.

The pedestal assembly can also advantageously be provided with an optional pedestal heater (not shown) which includes an electric resistance heating element. Although not preferred, the pedestal heater can be used in some processing situations where heat input from below is desirable.

Fluid Cooling Circuits

The thermal processor 10 is preferably provided with two main fluid cooling circuits. The first or inner fluid cooling circuit passes between the outer surface of the processing tube 18 and the inner surface of the furnace liner 82. The first cooling circuit has a first flow path 75. The second or outer fluid cooling circuit passes along the outside of the furnace liner 82 and along the inside surfaces of the heating enclosure subassembly 88. The second cooling circuit has a second flow path 77. The first and second fluid cooling circuits preferably extend in opposite or counterflowing relationship to provide more even temperatures during cooling. Air is preferably utilized as the cooling fluid in both circuits. Alternatively, various other thermally conductive gases can be utilized.

FIG. 10 shows that the first cooling circuit flow is preferably introduced through the cooling fluid supplies 99, passageways 89 and is distributed via annular chamber 46. The cooling flow passes through ports 45 an into the space between liner 82 and processing tube 18. FIG. 3 shows that the flow moves upwardly to the top of the liner and is exhausted via connection fitting 85. The first fluid cooling circuit then continues through the conduit 122. Conduit 122 includes a flange 341 which is engaged by a spring-loaded gasket 342 that seals about the conduit. The upper end of conduit 122 extends through an aperture into and flow plenum 349. Flow plenum 349 also is connected to receive the flow from risers 139. The area about conduit 122 and between plenum 349 is advantageously packed with a suitable high temperature packing 347, such as a fibered ceramic wool material.

Flow plenum 349 also supports and serves as an intake plenum for a flow mover 350. Flow mover 350 is preferably an air flow amplifier operating on the coanda effect and driven with compressed air. The unit functions as both a first fluid flow mover for the first fluid cooling circuit, and a second fluid flow mover for the second cooling circuit. One appropriate flow mover is manufactured by Exair Corporation. Other types of flow movers or motors are possible, although the preferred flow mover is advantageous in that no moving parts are needed and thus the risk of particles being generated is reduced.

The cooling fluid mover 350 has an outlet 351 which is movable vertically with the head assembly 25. Thus it is advantageous to have a flexible duct 359 which expands and contracts in length to accommodate this movement. Flexible duct 359 is preferably a spiral spring member which can extend and contract as needed to accommodate the vertical motion.

The second fluid cooling circuit has a flow 77 which is preferably introduced through exterior ports 120 near the top end of the heating enclosure subassembly. The second coolant flow 77 is distributed within annular manifold chamber 118 so as to be evenly introduced through the individual ports 110 into the space between the heating enclosure subassembly and the furnace liner. The flow then preferably moves downward and is passed out through heater base 102 via passageways 111. Passageways 111 are in fluid communication with the annular chamber 126 which accepts the flow from the numerous passageways. The second cooling flow then passes out through side ports 124. The flow from side ports 124 are preferably taken via riser ducts 139 to the flow plenum 349 and flow mover 350.

Process Chamber Outflow

Figure 21:
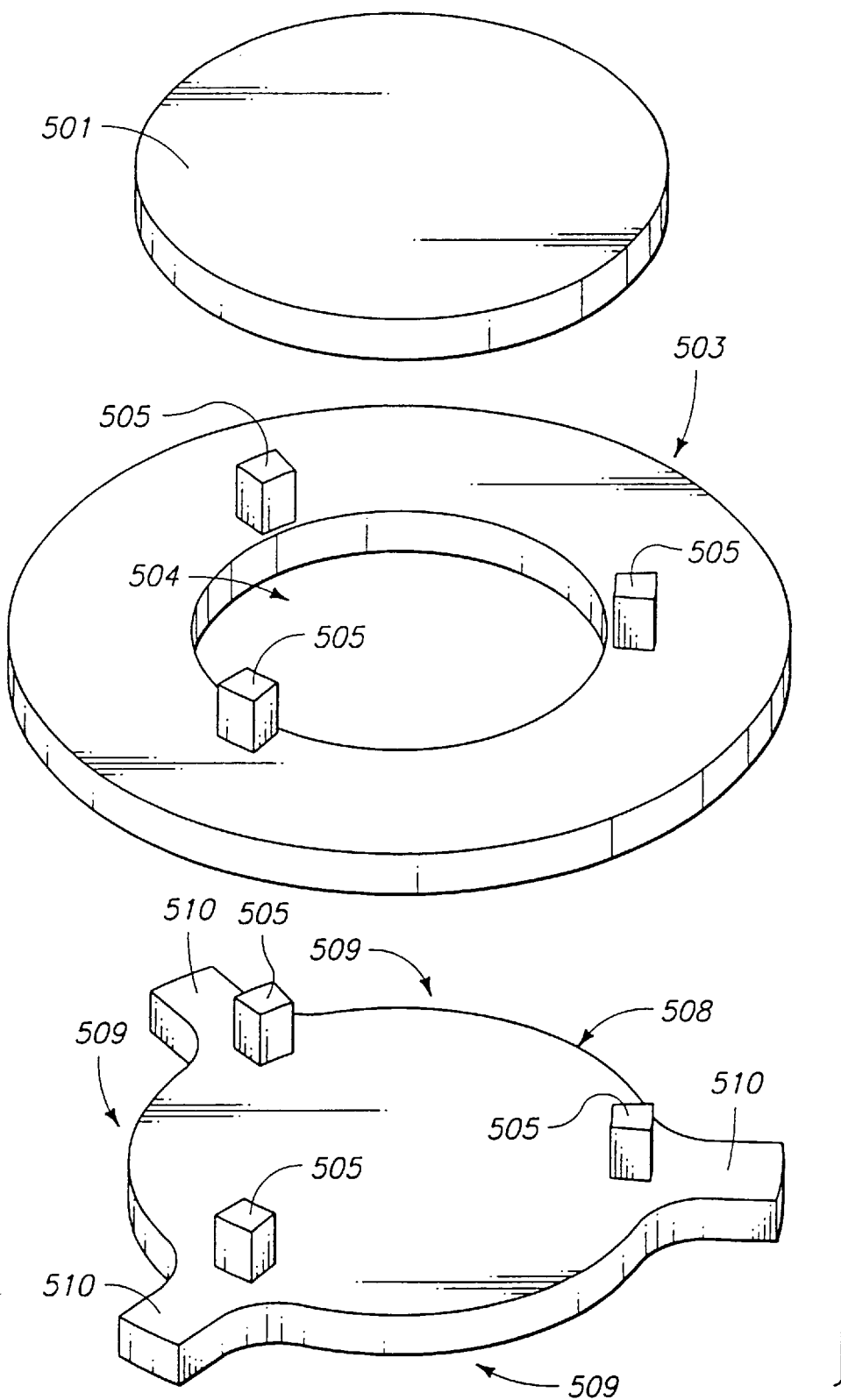
FIG. 21 is an exploded perspective view of a baffle array shown is FIG. 10.
Figure 22:
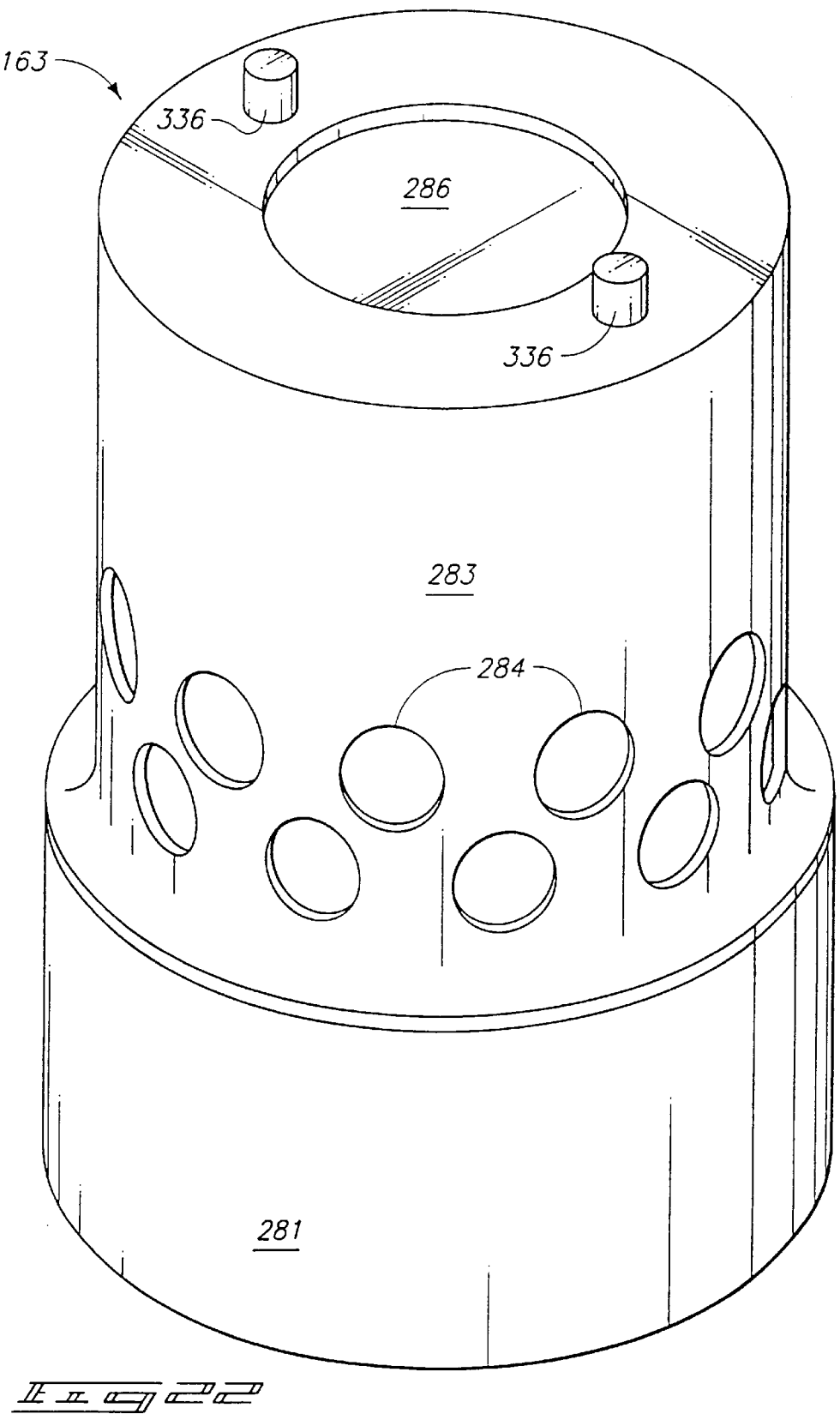
FIG. 22 is an enlarged perspective view of the pedestal assembly shown in FIG. 10.

The thermal processor 10 also includes a process chamber outflow which is designed to reduce temperatures in the associated parts of the processor. As FIG. 4 illustrates, the outflow preferably includes an outflow baffle array 278. The outflow baffle array is shown in greater detail in FIG. 21. The preferred construction includes a first or top baffle 501. Top baffle 501 deflects the downwardly exiting process gases outwardly and causes the gases to pass about the outer periphery of the top baffle.

The baffle array also includes a second or intermediate baffle 503. Second baffle 503 extends outwardly to the inner wall of the process tube 18 to deflect the flowing gases inwardly and through a central aperture 504. The top baffle is supported upon the second baffle using spacers 505. Spacers 505 are preferably bonded to the second baffle although other constructions are alternatively possible.

The baffle array also includes a third or bottom baffle 508 which has several peripheral openings or notches 509 which allow the exiting flow of processing gas to move therethrough. The third baffle's central area is solid to force the flow through peripheral openings 509. The peripheral spokes or lugs 510 support the array upon a suitable support such as an inner liner 520. The baffle array reduces the likelihood that gases or other contaminants contained in the outflow chamber below may migrate upwardly and into processing chamber 16.

Figure 20:
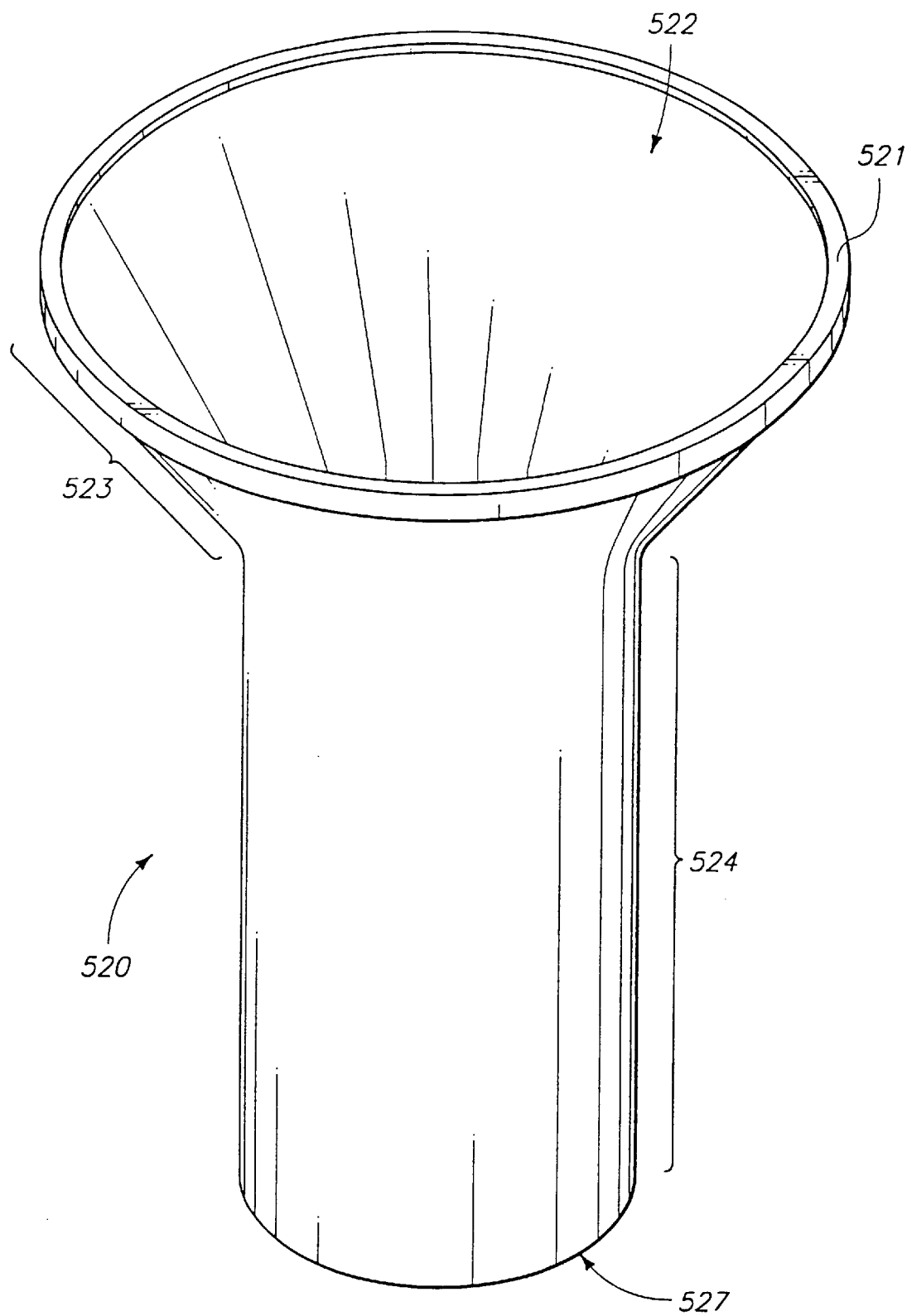
FIG. 20 is a perspective view of the outflow inner liner shown in FIG. 10.

FIG. 20 shows the inner liner 520 in isolation from other parts of the processing chamber outflow components. The inner liner 520 is supported upon a ledge formed upon the pedestal collar 271. To accomplish this, the inner liner includes a top peripheral flange 521.

The inner liner 520 has an entrance or mouth 522 at a top end and an exit or discharge 527 at a bottom end. The inner liner 520 is preferably formed as a sleeve which has an upper portion 523 and a lower portion 524. The upper portion is frusto-conically shaped. The converging downwardly conical shape directs the outflowing gases into the lower portion 524. The lower portion forms a downward extension which can advantageously be formed in a cylindrical shape. The inner liner shields the lower portions of the base plate assembly from direct impingement from the outflowing hot processing gases and thereby reduces temperatures of such parts. The inner liner is advantageously made from quartz or other suitable materials for the processing gases being used.

Processing Chamber Outflow Cooler

FIG. 4 shows that it is also possible to include an outflow cooler 600 which extends the outflow section of the thermal processor and reduces the temperature of outflowing exhaust gases from the upstream processing chamber. Outflow cooler 600 is downstream from other portions of the outflow explained above. The outflow cooler preferably includes an outflow cooler sleeve or casing 602. Casing 602 preferably is made from a relatively strong and thermally conductive material, such as stainless steel.

The casing can advantageously be provided with a casing top flange 604. Top flange 604 allows the cooler 600 to be at least partially supported upon the exit duct end piece 253 utilizing the J-hook fasteners 258 coupled with flange 257.

The bottom of casing 602 is advantageously provided with a discharge port 609. The discharge port is adjacent to a casing bottom shoulder 608.

The outflow cooler 600 also preferably includes an outflow cooler lining 605. Lining 605 is preferably made from a material which is non-reactive to the processing environment. A preferred material is Teflon™ polymer material. The Lining 605 is advantageously provided with a coupling head or flange 606. The upper end face of coupling head or flange 606 engages with the main outflow seal 259 to form a fluid tight coupling and continuation of the outflow side walls. The bottom portions of the lining 605 include a shoulder 640 which bears upon the shoulder 608 provided in the casing. The lining also has a discharge port wall section 643. Both shoulder 640 and discharge section 643 are formed with a heavier wall thickness than the side walls to help withstand the high temperatures and load imposed by carrying the flow diverter thereon.

The outflow cooler 600 also includes a heat exchanger 621 for removing heat from the side walls of the outflow cooler casing. The heat exchanger can be mounted upon the casing or be formed as part of the sidewalls of the casing. As shown, casing 602 is provided with a helical cooling tube array which spirals along the outside surface of the casing. The cooling tube array is mounted in a manner which provides good thermal conductive coupling with the casing. This can be done by a variety of techniques including simple contact or physically coupling using welding or brazing. Alternatively, the casing could be constructed with double walls and the coolant be trained therethrough to remove heat.

The outflow cooler 600 also preferably includes a flow diverter 630. Flow diverter 630 is centrally mounted to divert the flow of outgoing gases against the cooled side walls of the cooler. The flow diverter is advantageously made from a temperature resistant material, such as quartz, to withstand the direct flow of hot processing gases. Because of the reduced cross-sectional area, the flow diverter increases the velocity of the outflowing gases along the cooled interior side walls provided by liner 605. The diverter also brings all outflowing gases into closer proximity with the cooled side walls. This improves heat exchange and reduces the temperature of the outflowing gases.

The flow diverter 630 is advantageously formed as an annular body having relatively thin shell which can easily respond to temperature variations. The top end 631 of the flow diverter is preferably provided with a bulbous shape which improves flow thereover. The bottom end wall 632 has a vent hole 635 which allows gases to move into or from the interior of the flow diverter as temperatures vary.

The flow diverter 630 is also preferably provided with a set of flow diverter feet 636. Feet 636 are preferably provided in a tripod arrangement. The feet can be bonded to the bottom end wall 632. Feet 636 are advantageously made of quartz or otherwise made of the same material as the flow diverter. In one preferred form of the invention, the feet 636 have sloped bottom feet surfaces which set in complementary relationship with a sloped shoulder 640 formed on the liner 605.

Figure 31:
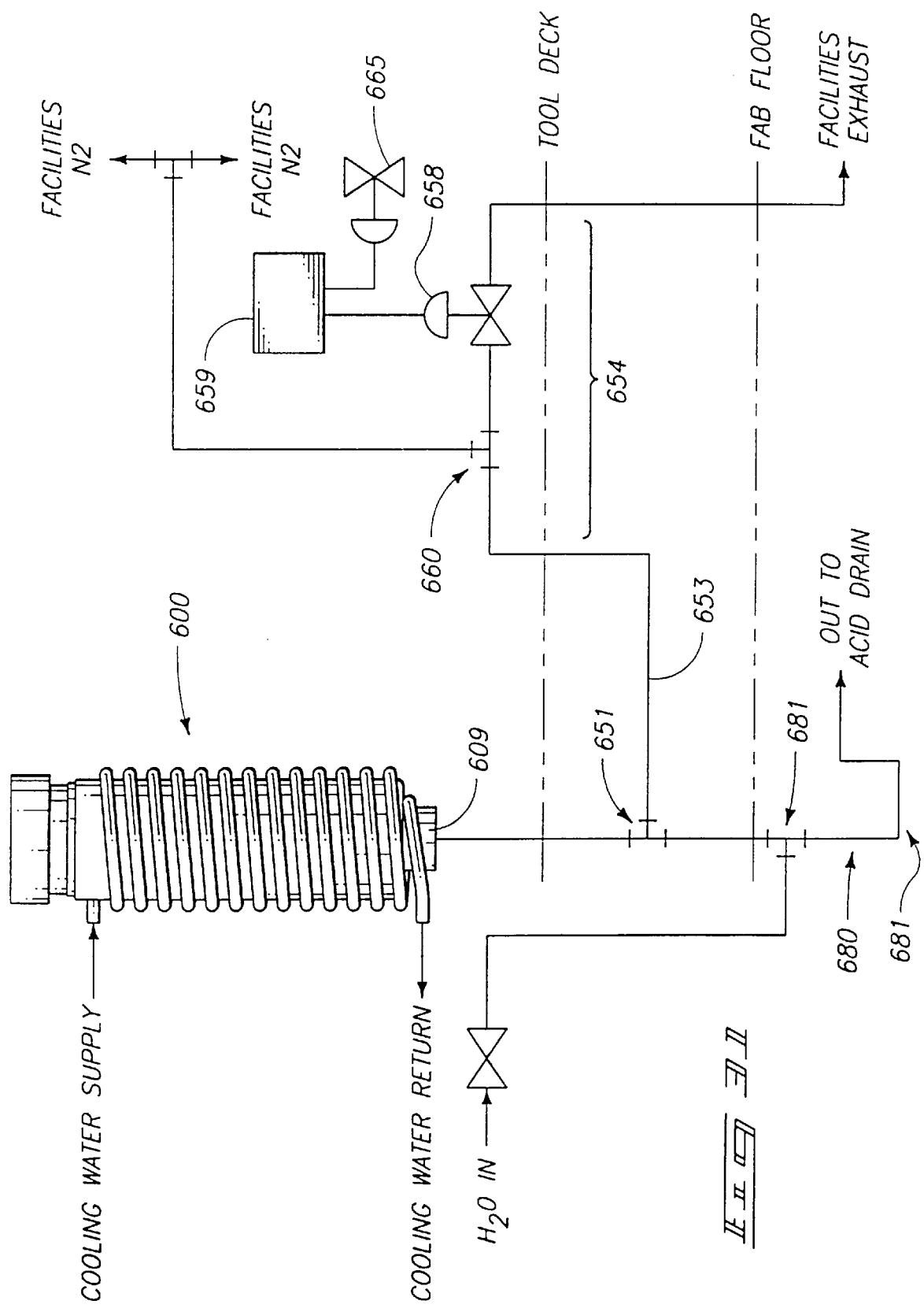
FIG. 31 is a preferred outflow piping arrangement used with the outflow cooler shown in FIG. 10.

FIG. 31 further shows a preferred outflow plumbing arrangement used with the processor 10 when the outflow cooler 600 is utilized. The outflow from cooler 600 at discharge 609 is plumbed to a tee 651. Tee 651 branches to a gas discharge line 653 which has an elevated section 654 which is above the tee 651. A control valve 658 is controlled by a valve controller 659 which is controlled directly or indirectly by the general controller described below. A purge fitting 660 is applied upstream of the control valve 658 to purge the outflow piping with nitrogen or other suitable purge gas. The purge fitting 660 is supplied with purge gas as controlled by purge flow control valve 665. Valve 658 controls flow through the gas discharge branch 653. In one preferred form, the valves 658 and 665 can be integrated, to provide simultaneous control of both functions from a single unit. The downstream side of control valve 658 is connected to a facilities exhaust at an elevation below tee 651.

FIG. 31 also shows a liquids discharge branch 680 which extends downwardly from tee 651. The liquids discharge is provided with a water flush via flush connector 681 which is provided with a stream of deionized water controlled by flush control valve 683. A flow indicator 684 can advantageously be employed. The liquids outflow from connector 681 is passed through a gas trap 687 and then to a suitable drain for disposal of acid containing waste streams.

Methods and Operation

The thermal processor 10 is preferably operated using the following methods. Wafers 14 or other semiconductor articles are first processed by loading the articles into the processor. This is advantageously done by opening the access door 9 and either manually or automatically placing the articles into the loading chamber 11. After the wafers have been placed into the loading chamber, then the wafers are held by inventorying the wafers on inventory stand 13 or other suitable structure.

In processor 10 the inventoried wafers are then preferably relocated from the inventory position by transferring the wafers. This is done by moving the wafers. The moving operation typically involves removing the wafers from the wafer carriers 17 using the wafer transfer mechanism 48. Each wafer is moved by relocating the wafer from the carrier into a suitable location adjacent to the loading chamber. In the most preferred methods the relocating takes place by moving the wafers from the inventory positions to the pre-load boat 54. The relocating preferably takes place by moving the wafers at the same or nearly the same elevation so that vertical changes are avoided.

Processing also preferably includes the step of opening the processing vessel to allow access to chamber 16. This is done by retracting the head assembly 25 upwardly. The retracting is capable of being done in separate steps. A first retracting step includes retracting the furnace heater assembly 22 upwardly using actuators 28. This retracting can either be followed or concomitantly associated with retracting the processing tube assembly. The processing tube assembly is lifted upwardly in the retracting step using processing tube lift actuators 26 which are retracted.

Processing using thermal processor 10 also preferably includes loading the wafers or other semiconductor articles 14 into the processing boat 12. This performs by providing an array of semiconductor articles supported upon the processing boat. The loading is advantageously accomplished by transferring the wafers from the pre-load array 54 to the processing boat array using wafer transfer 48. This transferring and relocating preferably takes place by moving the wafers at the same or nearly the same elevation so that vertical changes are avoided.

The methods and operation further typically involve closing the processing vessel to substantially enclose the processing chamber therewithin. The closing operation advantageously includes extending the processing tube 18 downwardly and over the processing array. This is most preferably accomplished by extending the actuators 26 and lowering the lift ring 30. The closing operation can also involve extending the processing head 25 downwardly. This is advantageously done by extending the actuators 28 and moving the furnace heater assembly 22 downwardly. If the processing tube assembly is already lowered, then the actuators 26 are simultaneously retracted as the actuators 28 are extended.

The methods also include providing a furnace heater having a furnace chamber within which the processing vessel is positioned. The methods also include heating the processing vessel and processing chamber with the furnace heater assembly 22. The heating can be done alone or with other processing steps involving exposing the semiconductor articles to various chemicals, particularly gases, as is well-known in the art. During processing, the processing chamber can be supplied with desired processing gases via tube 176. The outflowing gases are then cooled by discharging them through the preferred cooler 600.

After the heating is accomplished then the articles are cooled. The cooling step is preferably effected by providing or flowing a first cooling fluid flow adjacent the processing vessel. The first cooling fluid flow is advantageously accomplished by flowing the cooling fluid near the processing chamber seal and then upwardly along the outside of the processing tube 18.

The cooling step is also preferably effected by providing or flowing a second cooling fluid flow adjacent to the furnace heating assembly. The second cooling fluid flow is advantageously accomplished by flowing the cooling fluid downwardly and along the inside of the heater subassembly. The second cooling fluid flow is preferably done in countervailing relationship to the first cooling fluid flow. The countervailing relationship is best done segregated along opposite sides of a common thermally conductive baffle, such as the furnace liner 82.

The methods also preferably include opening the processing chamber after cooling a desired amount of time. The opening is the same or similar to that described above.

The methods further preferably include unloading the wafer boat 12, such as by using the automated wafer transfer 48. The unloading of the processing boat is advantageously done by transferring the wafers or other semiconductor articles to the cooling boat 56. Thereafter the wafers can continue to cool in the cooling boat.

The methods can further include transferring the articles 14 from the cooling boat to the inventory stand 13, and then inventorying the articles thereon until removed. The transferring is advantageously done by moving the articles to wafer carriers 17 or similar carriers for holding the articles.

Furnace Power Controller

It will be appreciated that it becomes necessary to use a sophisticated dynamic control system in order to achieve a uniformed thermal distribution within a processing chamber 16 during various processing cycles. Temperature must be dynamically monitored outside the processing chamber via spike thermocouples 128 and 130 as well as within the processing chamber via profile thermocouples 180. At the same time, timely and accurate decisions must be made on when and how long each heater element segment 90–96 and 101 should be activated and deactivated in order to achieve the desired uniform thermal processing environment in the process chamber 16. To achieve this result, a furnace power controller 350 is used. The furnace power controller 350 is preferably implemented in conjunction with a model based controller 352 in order to dynamically and accurately control the furnace heater elements responsively to a desired thermal model configured on controller 352 and measured temperatures obtained via the thermocouples.

The furnace power controller 350 is hosted on a control computer, such as an Intel based 80486 DX model controller or other suitable controllers. Likewise, the preferred model-base controller 352 is preferably hosted on a separate computer of the same or similar design. The model based controller 352 implements a real-time control system that employs multi-variable real-time feedback control. Preferably, the model-based controller 352 is a software-based system which uses empirically derived parameters which provide relatively good predictive estimation of wafer temperatures. One possible system is described in U.S. Pat. No. 5,517,594. Another is described in U.S. Pat. No. 5,895,596, entitled "Model Based Temperature Controller for Semiconductor Thermal Processors". Both such example systems are incorporated by reference.

Controller 352 forms a high fidelity dynamic model that describes the behavior of wafer temperatures and key film and device properties such as oxide and polysilicon film thickness and diffusion drive-in that are needed to optimize wafer uniformity and processing cycle time. The controller 352 consists of optimization software comprising a model of the furnace that accurately describes the thermal behavior of a particular furnace resulting from data acquired from test experiments that enable characterization of the heater power requirements and thermocouple measurements.

Figure 23:
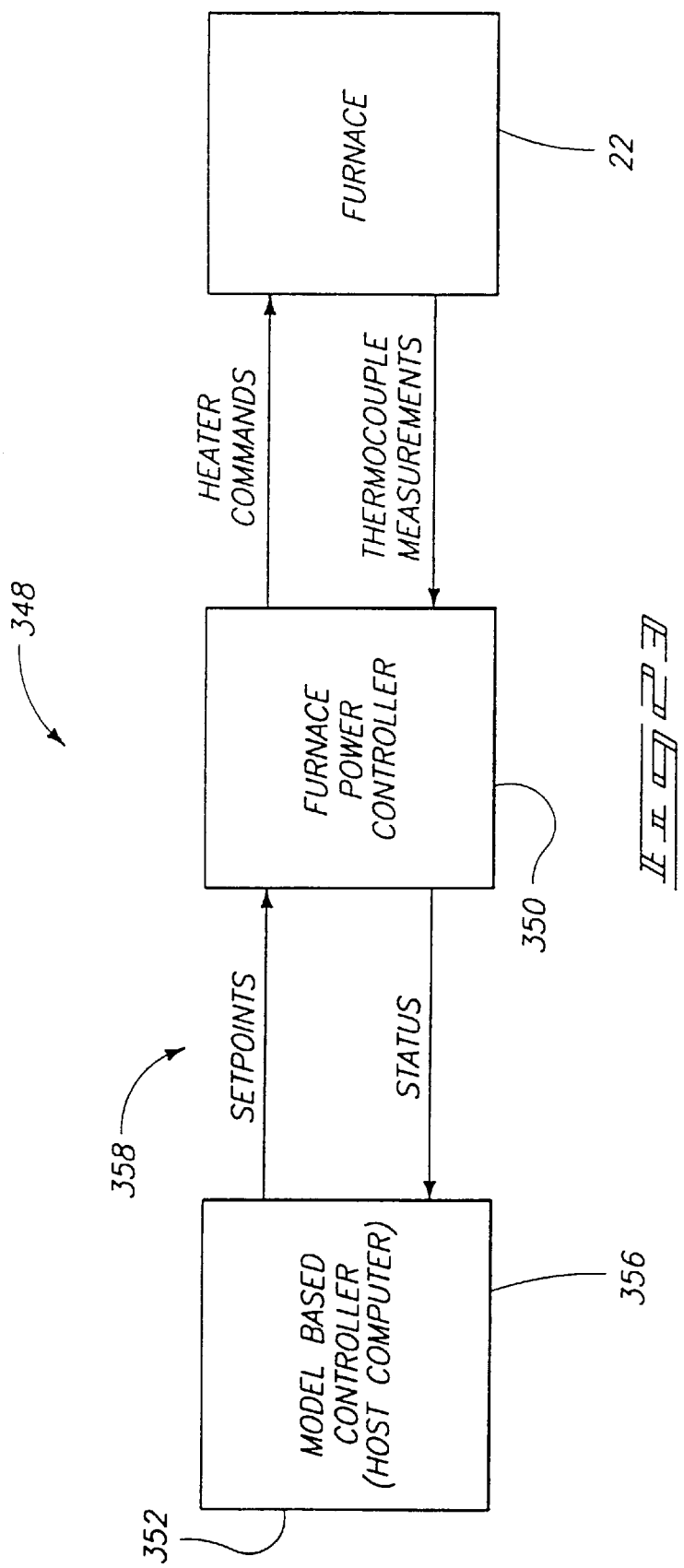
FIG. 23 is a block diagram showing a preferred furnace control system used in the thermal processor of FIG. 1.

The resulting control system 348 illustrated in FIG. 23 can implement complex multi-variable controllers to regulate application of heat via the heater elements which represents a significant enhancement over existing prior art commercial PID controllers. Preferably, the furnace power controller 350 and the model-base controller 352 both utilize a standard rack mount that fits directly into computer control cabinet 58 forming part of the tail section 42. In operation, the furnace 22 is electrically coupled to send thermocouple measurements as input to the model-base controller 352 as shown in FIG. 23. Controller 352 receives the thermocouple signals and sends heater command signals directly to the furnace. Concurrently, the furnace power controller 350 sends status signals to the model base controller 352 and the controller 350 sends set point signals to the controller 352.

Controller 352 is preferably a multi-variable controller having two types of set point trajectories; namely, a multi-variable control having flat trajectories and a dynamic optimization with time-bearing set point trajectories. In this manner, a model-based temperature is characterized in order to make wafer temperatures follow the desired set point trajectories from the two above mentioned trajectory types. In this manner, a model-based temperature control for controller 352 employs a multi-variable controller which uses an on-line model to generate estimates of wafer temperatures.

Figure 24:
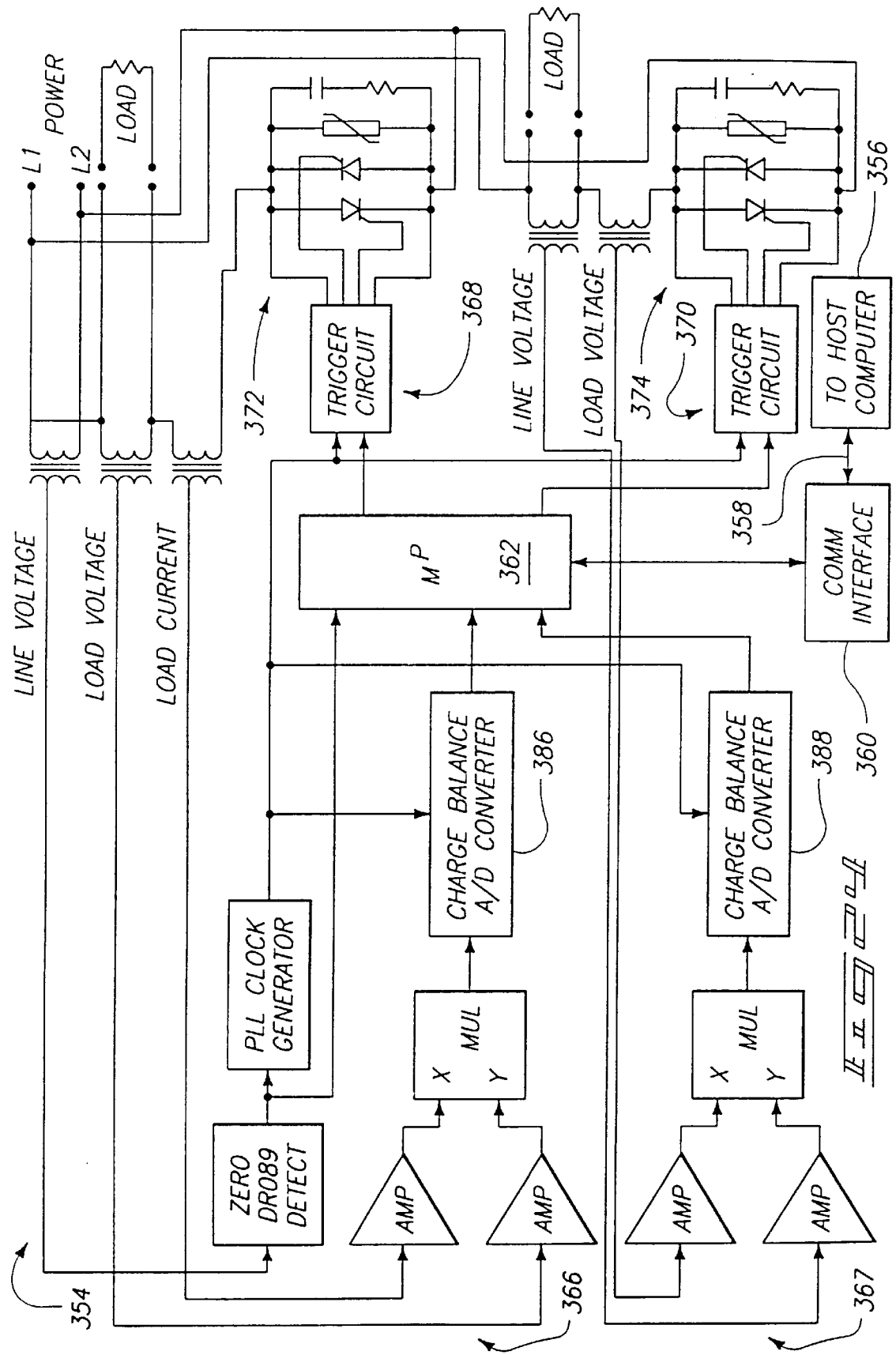
FIG. 24 is a block diagram of a preferred furnace power controller used in the thermal processor of FIG. 1.

FIG. 24 is a block diagram of the power controller circuit 354 comprising a preferred form of furnace controller 350. Circuit 354 forms a module that controls the actual power supply to each of the heating elements 90–96, 101 and any ancillary pedestal heater which might be optionally included in the furnace. Preferably, silicon controlled rectifiers (SCR) 392 are implemented to control the actual power supply using the phase angle firing characteristics of the SCR's. FIG. 24 depicts the circuit of a single power control module capable of supplying power to two heater zones in the furnace, with independent control available to supply power to each of the two zones. For example, heater elements 90 and 91 can be supplied by a single module as depicted in FIG. 23. Additionally, the two zones supplied by a single module preferably will be connected to the same phase of an alternating current power line.

As shown in FIG. 23, a microprocessor based host computer 356 supplies a set point command to the power control module 354 by way of a serial communications link 358. A communication interface 360 on module 354 relays the set point command to a dedicated microprocessor 362 on the module. The set point command received by the microprocessor 362 defines the desired load power in watts. In this manner, host computer 356 is configured to read the measured load power in watts over the serial communication link 358. Hence, a gang of power controllers may share the same serial communications link 358, wherein each controller module or circuit 354 is assigned a uniquely identifiable address.

A circuit module 354 constructed according to the layout of FIG. 24 provides several unique features. In one case, the host computer 356 comprises the microprocessor of the model-base controller 352 such that the input from the host computer 356 that controls the two heater elements connected to the module is the desired load power and the watts obtained from the model-based controller 352. A second desirable feature results because circuit module 354 measures both the load voltage and the load current for each element such that the actual power delivered to each load, or element can be calculated. An additional unique feature results because circuit module 354 forms a true power controller. More particularly, circuitry in the module adjusts the firing angle of SCR's via a control loop in order to achieve the desired power from the model-based controller 352 delivered to the load in the presence of variations in line voltage and load impedance. Furthermore, in response to a command via communication link 358, the circuit module 354 will report the measured power presently being delivered to the load, in watts. Another unique feature results since the power measurement circuitry in the module determines the load power on a cycle by cycle basis which enables the circuit module to respond rapidly to changes in line voltage or load impedance.

A pair of power measurement circuits 366 and 367 and a pair of SCR trigger timing circuits 368 and 370 are configured independently of the frequency of the alternating current power line. Therefore, no adjustments to the circuits are needed when operating at 50 or 60 hertz.

In order to better understand the functional characteristics of circuit module 354, various circuit subassemblies are further depicted in FIGS. 25–29. As shown in FIG. 24, circuit 354 includes a power switch circuit configured to enable the switch to conduct both during the positive and negative half cycles of an alternating current wave form provided in the line power. A separate power switch circuit 372 and 374 is provided for each heater element. The trigger timing circuits 368 and 370 are shown configured to each form a timing circuit, respectively wherein a PLL clock generator circuit 380 generates a high frequency clock from the alternating current (AC) power line to synchronize operation of each trigger circuit.

A power measurement circuit 366 and 367 is shown configured to measure the actual power delivered to the load from each heating element on a cycle by cycle basis. Each power measurement circuit 366 and 367 is shown configured to an A/D converter 386 and 388 that produces a digital output consisting of an integral of the input voltage over a complete cycle of the AC line voltage. Each A/D converter includes a synchronous voltage to frequency (V–F) converter 390 and 392, respectively, that produces a train of output pulses representing a discrete amount of charge delivered into the analog input. The pulses are accumulated during each cycle and counted wherein the microprocessor reads the stored value in a latch resulting from the count such that the average charge delivered to the input of the converter can be determined by counting the pulses in the counter at the end of the cycle which will be independent of the frequency of the AC line.

In the above manner, the average power delivered to the load, or particular heater element, during one cycle can be determined from the number of pulses in the counter at the end of a cycle. Hence, in this manner, the furnace power controller 350 can deliver status commands to the model-based controller 352 over a serial communications link. The status commands are the actual load power transmitted to each heating element which is received by controller 352 in order to evaluate dynamically new heater commands.

Figure 25:
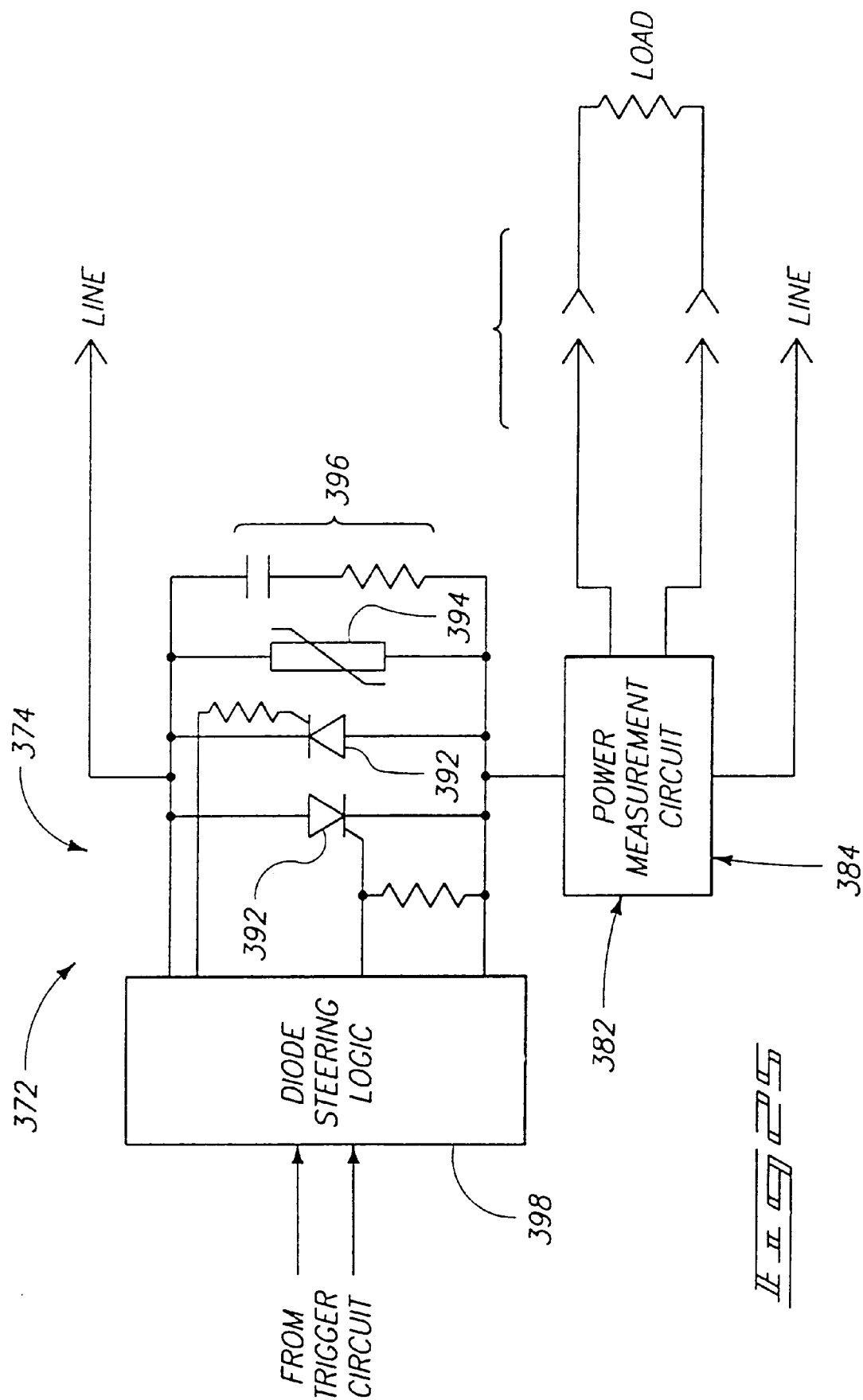
FIG. 25 is a block diagram illustrating power switching circuitry used in the power controller of FIG. 24.

With particular reference to FIG. 25, each power switch circuit 372 is formed from a pair of semiconductor controlled rectifiers (SCR's) 392 shown connected back to back and parallel with a metal oxide varistor (MOV) 394 and a resistor/capacitor (RC) snubber 396. The SCR's, varistor and snubber are interconnected in parallel with diode steering logic circuitry 398 formed by a portion of the trigger circuit 368 and 370 discussed hereafter. The steering diodes in the circuitry 398 route a trigger pulse to one of the SCR's that is forward biased at that time. As a result, the power switch is enabled to conduct during both half cycles of an AC line power. Additionally, both SCR's are protected from damage by over voltage transients through electrical configuration of the MOV 394 and snubber 396. In the case of an over voltage transient, varistor 394 and snubber 396 cooperate to shunt or limit the rate of rate of rise of voltage where the peak of voltage across the SCR devices, especially when switching from a conductor to a blocking state or when subjected to an external voltage transient. Therefore, the rate of rise or fall of current through the device when switching on or off, respectively is limited.

Figure 26:
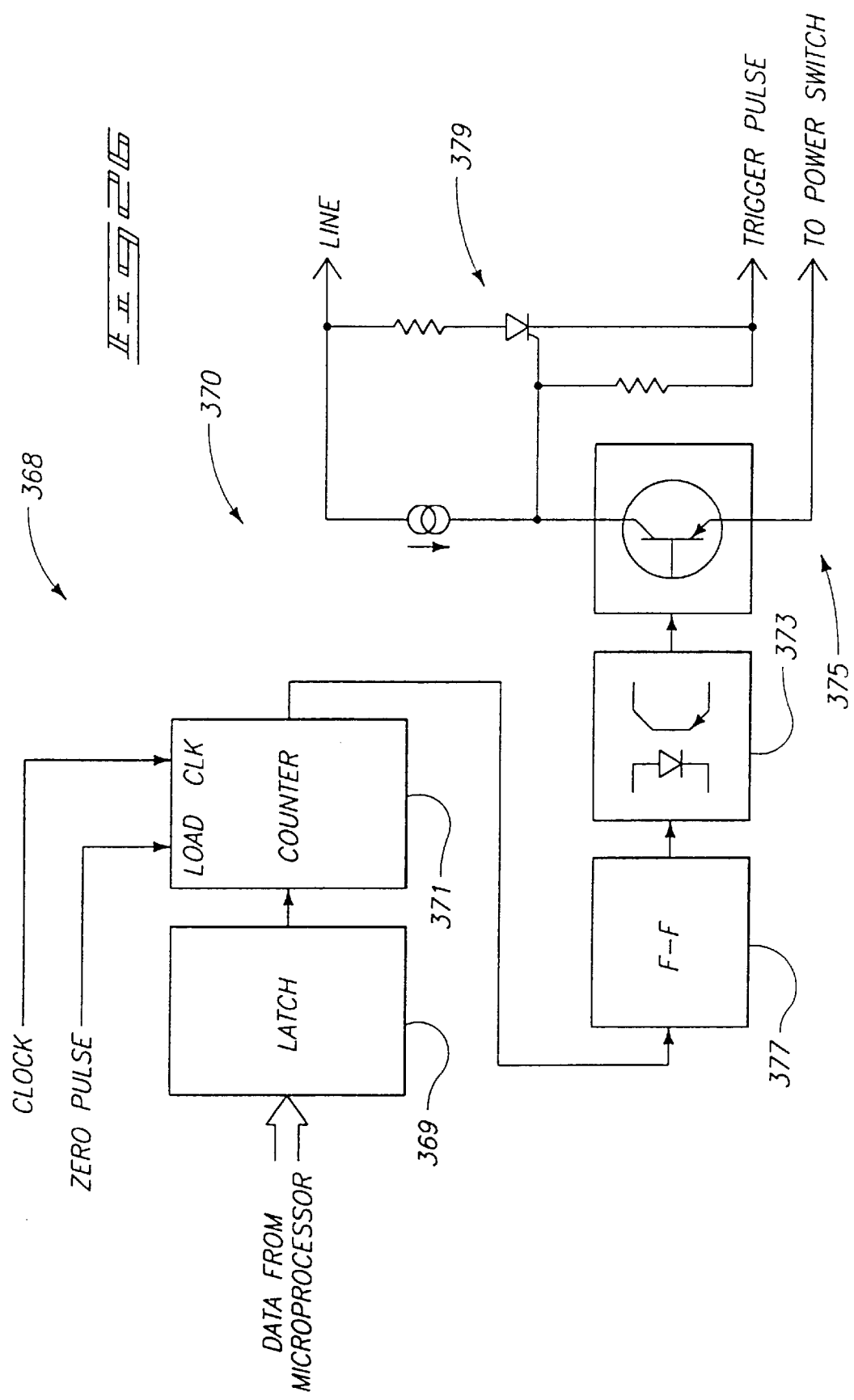
FIG. 26 is a trigger circuit block diagram illustrating trigger circuitry used in the power controller of FIG. 24.
Figure 27:
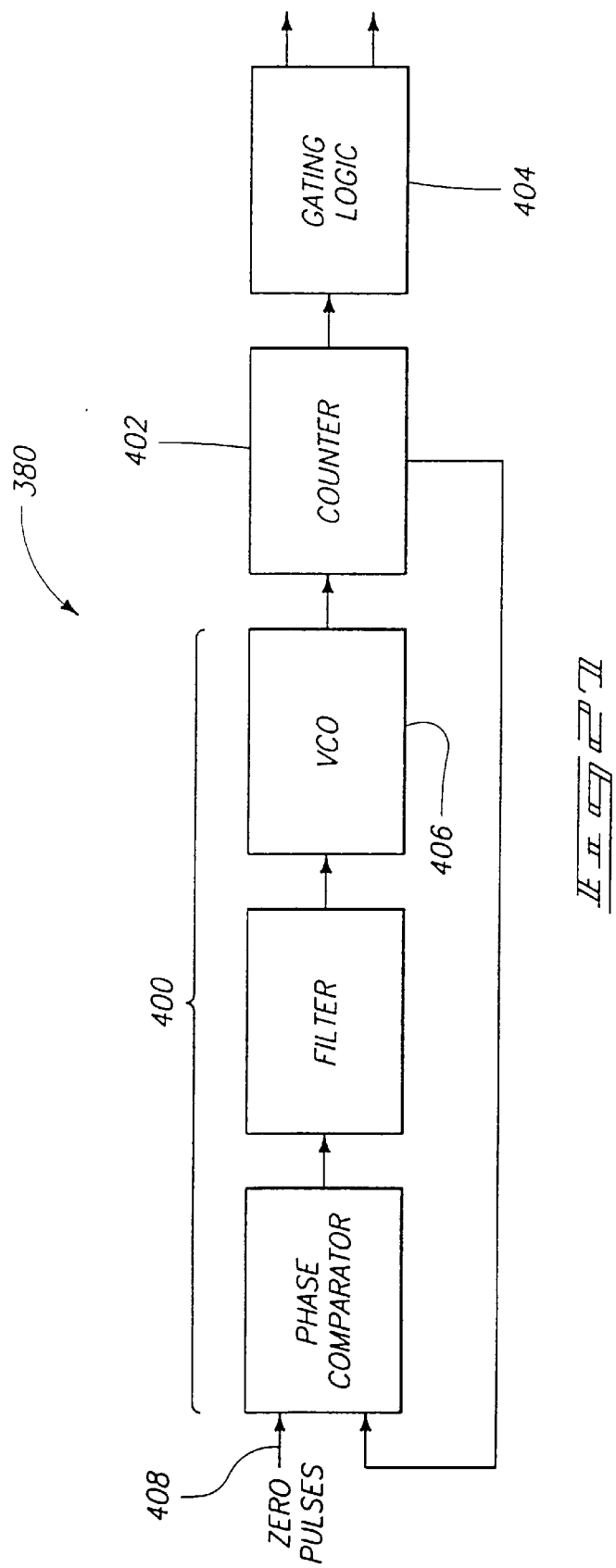
FIG. 27 is a clock generator block diagram illustrating clock generator circuitry used in the power controller of FIG. 24.

FIG. 26 depicts trigger circuit 374. Trigger circuit 368 is similarly configured. As shown, the trigger circuit consists of a data latch 369, a counter 371, an optical isolator 373 and a firing circuit 375. The data latch is configured to hold a digital value written to it by the microprocessor 362. The value stored in the data latch controls the face angle at which the SCR's 392 will be triggered. The counter counts the pulses of the high frequency clock generated by the PLL clock generator circuit 380 discussed hereafter. When a zero crossing pulse occurs, the counter is preset to the value stored in the data latch. The counter then counts up from this preset value until it reaches a maximum count, at which time a flip-flop 377 is set. The flip-flop provides a signal to the optical isolator 373. The optical isolator in response to the signal drives the firing circuit which amplifies the output signal from the optical isolator to a pulse of sufficient amplitude to trigger the main SCR's. Additionally, steering diodes 379 are provided in the firing circuit in order to route the trigger pulse to which ever SCR is forward biased at that time.

For the case where the counter is preset with a value near it's maximum count, the counter will count up to it's maximum count with few input clocks. As a result, the power switch will be triggered early in an AC cycle, thereby causing it to conduct for most of the current half cycle of the AC power. As a result, a large amount of power will be delivered to the load. In the event the counter is preset with a value of near zero, it will take many input clocks to count up to it's maximum count. In this event, the power switch will be triggered near the end of the current half cycle of the AC line power, thereby resulting a little power delivered to the load. As a general rule, the number of clock pulses produced by the PLL clock generator circuit 380 during each half cycle is found to be equal to the maximum count of the counter.

The phase lock loop (PLL) clock generator circuit 380 generates a high frequency clock that is synchronized at the phase of a transmitted signal; namely, an AC power line signal. The synchronized high frequency clock is used by both A/D converters 386 and 388 as well as the SCR trigger circuits 368 and 370. As shown in FIG. 26, the clock generator consists of a phase locked loop circuit 400 interconnected with a digital counter 402 and gating circuits 404.

In operation, the digital counter 402 is driven by a high frequency voltage controlled oscillator (VCO) 406. In operation, the phase locked loop circuit 400 adjusts the frequency of the oscillator 406 until the output pulses from the counter in synchronization with the input pulses in the zero cross detector at input line 408. As a result, the oscillator 406 becomes synchronized to the AC line voltage, and the resulting frequency of the oscillator becomes a multiple of the AC line frequency. The high frequency oscillator 406 is coupled to the gating logic circuits 404 which is configured to supply the above resulting clock signal to the A/D converter 386 and 388 and the trigger circuits 368 and 370. The gating circuit 404 is configured to supply synchronizing signals to both the A/D converter and the trigger circuit through one of several commonly known circuit implementations.

Figure 28:
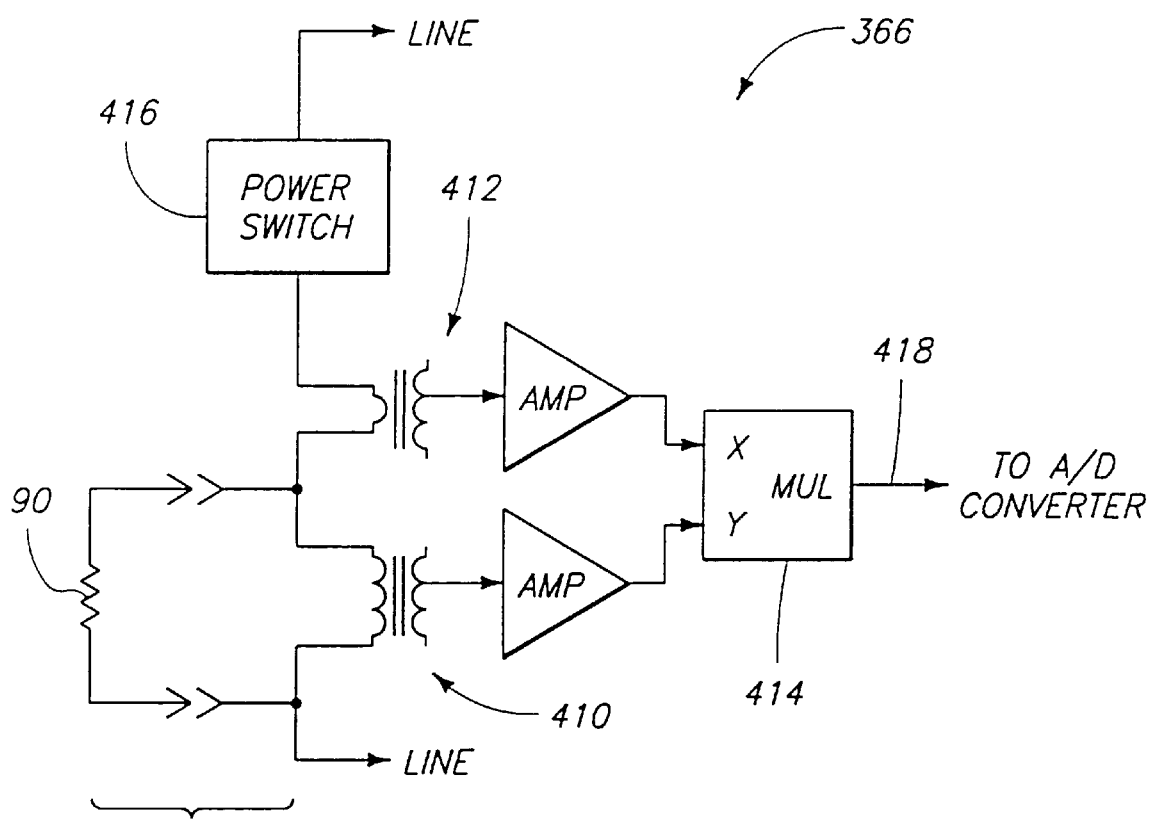
FIG. 28 is a power measurement circuit block diagram illustrating power measurement circuitry used in the power controller of FIG. 24.

Referring now to FIG. 28, the power measurement circuit 366 is illustrated utilizing a step down transformer 410, a current transformer 412 and an analog multiplier 414. Circuit 367 is similarly constructed. The power measurement circuit is configured to measure the actual power delivered to the load, e.g. a heater element, on a cycle by cycle basis. The microprocessor 362 uses the delivered power information in order to adjust the conduction angle of the SCR's 392 in order to maintain the desired power output in the presence of variations in line voltage and load impedance.

Circuits 366 and 367 are each configured to compute a value for load power from measurements of load voltage and load current. An instantaneous load voltage value is reduced to a suitable value by way of the step down transformer 410. Additionally, transformer 410 also isolates the circuit from the power line. The output voltage from the step down transformer is shown applied to an input of the analog multiplier 414. Similarly, the load current from a heating element 90 is sampled with the current transformer 412. An output voltage from the current transformer 412 is amplified to a suitable level after which it is applied to the second input of analog multiplier 414. Multiplier 414 receives a pair of output voltages to produce a voltage output along line 418 that is proportional to the product of the load voltage and load current and is essentially the instantaneously load power. Hence, line 418 applies the instantaneous load power as an input to the A/D converter 386, 388. Additionally, a power switch 416 is serially connected with respect to the power line.

Figure 29:
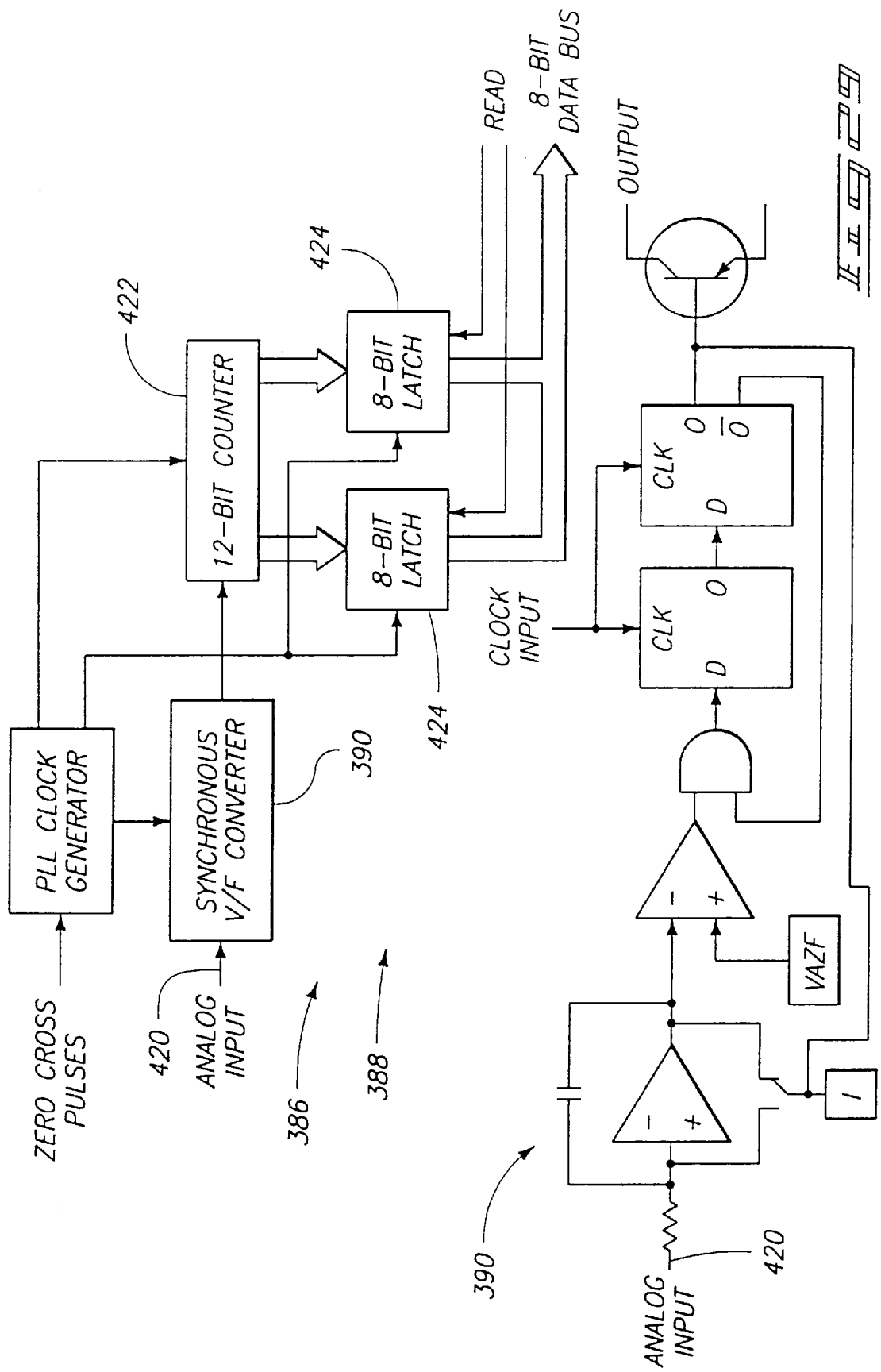
FIG. 29 is an analog/digital converter block diagram illustrating integrating charge balance converter circuitry used in the power controller of FIG. 24.

FIG. 29 depicts a preferred construction for the A/D converter 386 and 388 which forms an integrating charge balance converter. The converter is configured to provide a digital output that comprises the integral of the output voltage over a complete cycle to the AC line voltage. More particularly, an analog input 420 is fed into the synchronous voltage to frequency (V–F) converter 390, such that the converter 390 produces a train of output pulses with each output pulse representing a discrete amount of charge into the analog input. The pulses are fed into a counter 422 that accumulates the number of pulses during a complete cycle. At the end of each cycle, the count in the counter is stored in a latch 424 and the counter is reset for the next cycle. Microprocessor 362 then reads the value stored in each latch wherein:

The charge represented by each pulse from the V–F is $q=it$, where i is a constant current and t is the period of the clock to the circuit The total charge delivered to the input during one cycle of the AC line voltage is then represented by the number of pulses in the counter at the end of the cycle.

$q_{tot}=Nit$, where N is the number of pulses in the counter.

The average charge delivered during the cycle will be the total charge divided by the length of the cycle.

$$q_{ave} = \frac{Nit}{T}, \text{ where } T \text{ is the length of one cycle of the ac line.}$$

But the PLL causes the frequency of the clock to be a fixed multiple of the AC line frequency, T=mt, thus, $$q_{ave} = \frac{Nit}{mt} = \frac{Ni}{m},$$

where $m$ is the ratio of clock frequency to line frequency

The resulting average charge delivered to the input of the V–F converter can then be determined from the number of pulses in the counter at the end of the cycle and is independent of the frequency of the AC line.

Because the voltage applied to the input of the V–F converter is proportional to the instantaneous power and load, the average charge over a cycle will be proportional to the average power and the load over the cycle. Therefore, the average power delivered to the load during one cycle can be determined form the number of pulses in a counter at the end of the cycle.

General Controller

Figure 30:
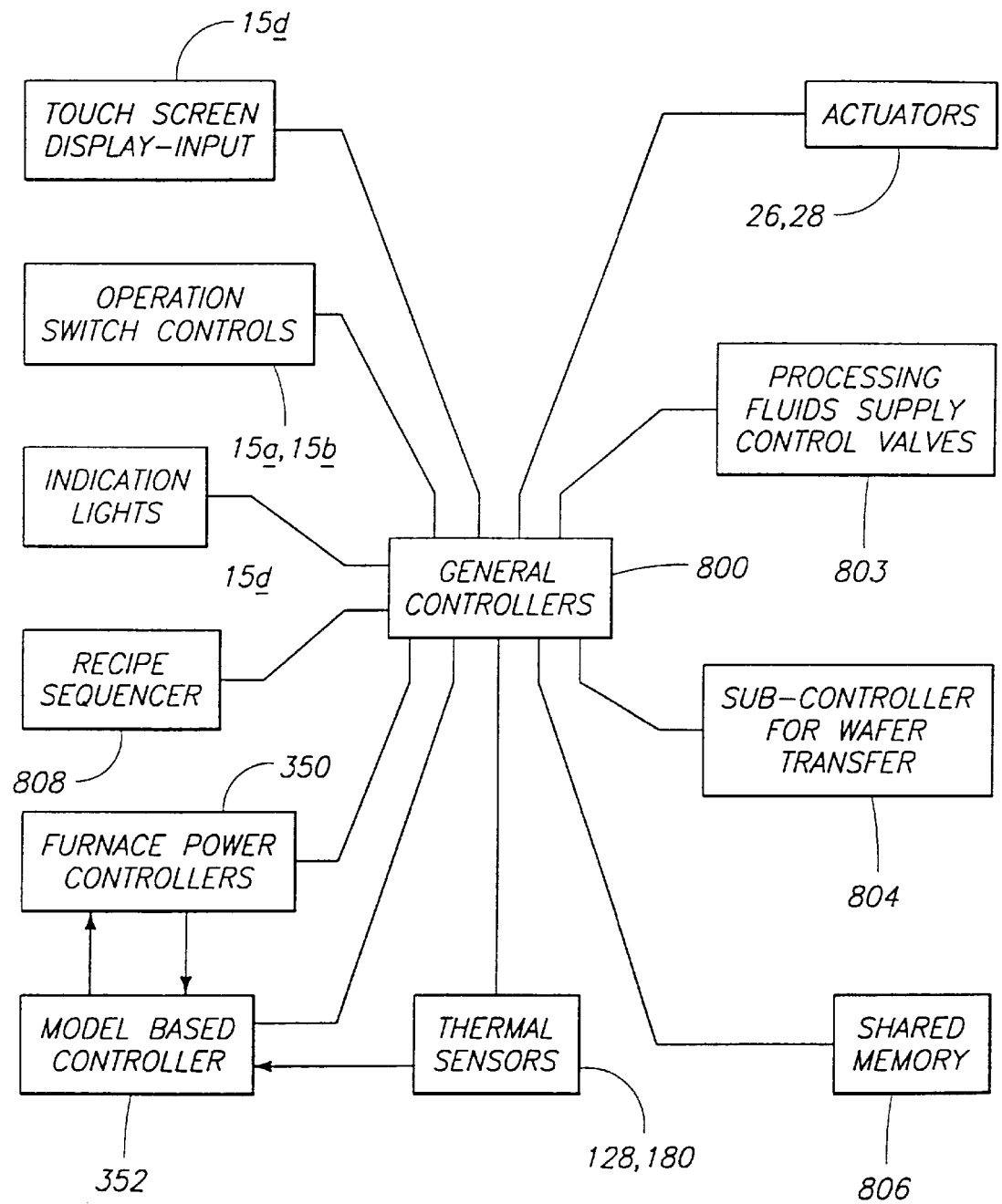
FIG. 30 is a schematic block diagram showing a general controller and functional relationships with components of the thermal processor of FIG. 1.

In addition to the power control system described above, there is also a general system controller 800 which can advantageously be provided in the form of one or more preferably plural microprocessor based systems, such as the 80486 DX systems described above or equivalents thereto. The general controllers connected to various components and sub-controllers used to provide proper operation of the thermal processor. FIG. 30 shows connection with the touch screen display-input 15d, operator switches 15a and 15b, and front panel indicator lights 15c and 15e. General controller 800 is also connected to the furnace power controller 350. Furnace power controller 350 preferably has plural control functions which are dedicated to the plural heating zones used in the processor 10. Power controller 350 receives signals from the general controller 800 used in control of the processor and also receives model based control signals from model based controller 352 and associated thermal sensor information from sensors 128 and 180. The model based controller is also connected to receive and provide control signals to controller 800. Thermal sensors 180 and 128 provide temperature information which is primarily used in the power controller but which is also supplied to the general controller for use in data display and other control functions.

General controller 800 also controls the actuators 26 and 28 which power operation of the head assembly 25. A variety of fluid valves are schematically shown as processing fluids control valves 803. The general controller also provides and receives signals to and from a wafer transfer sub-controller 804 associated with the wafer transfer 48 which controls the function of the wafer transfer.

Controller or controllers 800 also preferably take advantage of shared data memory 806 which can be utilized to the advantage of the general controller or other controllers forming part of the control system.

Manner of Making

The thermal processor 10 is made using the preferred materials indicated above or alternative materials which can perform under the conditions indicated. The various components and features described are provided by using know metal working and other machining techniques to provide the described structures and explained operation. A variety of manufacturing techniques can alternatively be used to make the preferred embodiment shown herein or other thermal processors according to the invention.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A heating control system for use with a semiconductor processing furnace of the type having a furnace heater carried about a process tube having a process chamber wherein the furnace heater heats the process tube so as to controllably regulate temperature of the process chamber while processing semiconductor devices therein, the heating control system comprising:

a furnace process unit having at least one heating zone with at least one heating element provided by the furnace heater;

a host computer including a thermal furnace model, the host computer comprising a furnace model-based controller providing a model of thermal behavior of the furnace correlating heater power and process chamber temperature, receiving inputs including temperature in the processing chamber and actual power delivered to the at least one heating element, and determining and transmitting desired load power inputs based on the inputs and the model of thermal behavior; and a furnace power controller including a CPU and a power measurement circuit configured to monitor the temperature within the furnace, and monitor and control the actual power delivered to the at least one heating element in the at least one heating zone in said process unit;

wherein the furnace power controller controls actual power delivered to the at least one heating element in response to desired load power commands received from the furnace model-based controller.

2. The heating control system of claim 1 wherein said furnace power controller further comprises a power switch circuit configured to conduct during both half cycles of an ac power line.

3. The heating control system of claim 2 wherein the power switch circuit comprises two SCR's electrically connected back-to-back and configured to alternately conduct during both half cycles of an ac power line.

4. The heating control system as defined in claim 3 further comprising voltage surge arrestor means connected in parallel with said SCR's to protect said SCR's from damage by over voltage transients.

5. The heating control system of claim 4 wherein said voltage surge arresting means comprises a metal oxide varistor and an RC snubber configured in parallel with said SCR's so as to protect the SCR's from overvoltage transients.

6. The heating control system of claim 1 wherein said furnace power controller further comprises a trigger timing circuit array communicating with said power controller, said power controller configured to adjust firing of said trigger timing circuit array so as to control the actual power supplied to the heating elements in the furnace.

7. The heating control system of claim 6 wherein the trigger timing circuit array comprises a data latch configured to hold a digital microprocessor written value controlling triggering of the trigger timing circuit, a counter counting clock pulses generated by a clock generator circuit, such that upon the occurence of a pulse crossing zero, the counter is preset to the value stored in the data latch, the counter counts up from such a preset value to a maximum count, at which time a flip flop is set, providing a signal to an optical isolator, wherein the optical isolator drives the firing circuit which amplifies the output signal from the optical isolator to a pulse of sufficient amplitude to trigger the trigger timing circuit, and steering diodes in the firing circuit route the trigger pulse to a forward biased portion of the trigger timing circuit.

8. The heating control system of claim 7 wherein the clock generator circuit comprises a PLL clock generator circuit.

9. The heating control system of claim 8 wherein the trigger timing circuit array comprises a pair of SCR's electrically connected back-to-back and configured to alternately conduct during both half cycles of an ac power line.

10. The heating control system of claim 1 wherein said host computer supplies a setpoint command comprising a desired load power input to said power controller via a serial communications link.

11. The heating control system of claim 1 wherein the power measurement circuit is configured to measure actual power delivered to a heating element on a cycle by cycle basis.

12. The heating control system of claim 11 wherein the power measurement circuit further comprises load voltage measurement means and load current measurement means, such that a corresponding load voltage and load current are respectively measured and utilized to calculate a load power value.

13. The heating control system of claim 12 wherein the load voltage measurement means comprise a step down transformer configured to scale the instantaneous load voltage, and the load current measurement means comprise a current transformer serially configured with an amplifier which scales the load current to a value in relation to the scaled load voltage such that the amplified load current and the scaled load voltage are applied to a current multiplier resulting in an output proportional to the product of load voltage and load current representative of instantaneous load power.

14. The heating control system of claim 13 further comprising an integrating charge balance amplifier configured to receiver the resulting instantaneous load power and produce a digital output relating to the integral of the input voltage over a complete cycle of the ac line voltage.

15. The heating control system of claim 14 further comprising a synchronous voltage to frequency converter configured to receive the input voltage and produce a train of output pulses representing discrete charge into the analog input, and a counter for accumulating the pulses during a cycle, the count in the counter being stored in a latch where the value is read by the microprocessor such that an average charge delivered to the input can be determined, and the average power delivered to the load during one cycle can be determined from the number of pulses in the counter at the end of the cycle.

16. The heating control system of claim 1 wherein inputs to the host computer further comprise previous temperature and previous supplied power.

17. The heating control system of claim 1 wherein inputs to the host computer further comprise previous rate of temperature change and previous power rate.

18. A heating control system for use with a semiconductor processing furnace of the type having a furnace heater carried about a process tube having a process chamber wherein the furnace heater heats the process tube so as to controllably regulate temperature of the process chamber while processing semiconductor devices therein, the heating control system comprising:
 a furnace process unit having a plurality of heating elements provided by the furnace heater;
 a host computer including a thermal furnace model, the host computer comprising a furnace model-based controller providing a model of thermal behavior of the furnace correlating heater power and process chamber temperature for each of the plurality of heating elements, receiving inputs including temperature in the processing chamber and actual power delivered to each of the heating elements, and determining and transmitting desired load power inputs based on the inputs and the model of thermal behavior; and
 at least one furnace power controller including a CPU and a power measurement circuit configured to monitor the temperature within the furnace, and monitor and control the actual power delivered to a corresponding one or more of the heating elements in said process unit;
 wherein the furnace power controller controls actual power delivered to each of the heating elements in response to desired load power commands received from the furnace model-based controller based on the thermal furnace model.

19. The heating control system as defined in claim 18 wherein at least on heater element defines a distinct heater zone.

20. The heating control system of claim 19 wherein a pair of heater elements define a distinct heater zone.

21. A heating control system for use with a semiconductor processing furnace of the type having a furnace heater carried about a process tube having a process chamber wherein the furnace heater heats the process tube so as to controllably regulate temperature of the process chamber while processing semiconductor devices therein, the heating control system comprising:
 a furnace process unit having a plurality of heating zones, each having at least one heating element which together provide the furnace heater;
 a host computer including a thermal furnace model, the host computer comprising a furnace model-based controller providing a model of thermal behavior for each of the heating zones of the furnace correlating heater power and process chamber temperature, receiving inputs including temperature in the processing chamber and actual power delivered to each of the heating zones, and determining and transmitting desired load power inputs based on the inputs and the model of thermal behavior; and
 at least one furnace power controller including a CPU and a power measurement circuit configured to monitor the temperature within one of the plurality of zones of the furnace, and monitor and control the actual power delivered to one or more of the heating elements in said zone;
 wherein the at least one furnace power controller controls the actual power delivered to the at least one of the respective heating elements in response to desired load power commands received from the furnace model-based controller based on the thermal furnace model.

22. The heating control system of claim 19 wherein said furnace power controller independently supplies power to two separate heater zones, wherein such heater zones are connected to the same phase of an ac power line.

23. The heating control system of claim 20 wherein said furnace process unit has seven distinct heating zones.

24. The heating control system of claim 21 wherein the heating zones are separately controlled by one of the furnace power controllers.

25. The heating control system of claim 21 wherein said furnace power controller further comprises a trigger timing circuit array communicating with said power controller, said power controller configured to adjust firing of said trigger timing circuit array so as to control the actual power supplied to the heating elements in the furnace.

26. The heating control system of claim 25 wherein the trigger timing circuit array comprises a data latch configured to hold a digital microprocessor written value controlling triggering of the trigger timing circuit, a counter counting clock pulses generated by a clock generator circuit, such that upon the occurence of a pulse crossing zero, the counter is preset to the value stored in the data latch, the counter counts up from such a preset value to a maximum count, at which time a flip flop is set, providing a signal to an optical isolator, wherein the optical isolator drives the firing circuit which amplifies the output signal from the optical isolator to a pulse of sufficient amplitude to trigger the trigger timing circuit, and steering diodes in the firing circuit route the trigger pulse to a forward biase portion of the trigger timing circuit.

27. The heating control system of claim 26 wherein the clock generator circuit comprises a PLL clock generator circuit.

28. The heating control system of claim 27 wherein the trigger timing circuit array comprises a pair of SCR's electrically connected back-to-back and configured to alternately conduct during both half cycles of an ac power line.

29. The heating control system of claim 21 wherein the power measurement circuit is configured to measure actual power delivered to a heating element on a cycle by cycle basis.

30. The heating control system of claim 29 wherein the power measurement circuit further comprises load voltage measurement means and load current measurement means, such that a corresponding load voltage and load current are respectively measured and utilized to calculate a load power value.

31. The heating control system of claim 30 wherein the load voltage measurement means comprises a step down transformer configured to scale the instantaneous load voltage, and the load current measurement means comprise a current transformer serially configured with an amplifier which scales the load current to a value in relation to the scaled load voltage such that the amplified load current and the scaled load voltage are applied to a current multiplier resulting in an output proportional to the product of load voltage and load current representative of instantaneous load power.

32. A method for controlling a semiconductor processing furnace of the type having a furnace heater carried about a process tube defining a processing chamber therein in which it is desired to realize an isothermal zone during thermal processing cycles to regulate temperature of semiconductor wafers contained therein, the method comprising the steps of:

providing at least one heating zone having at least one heating element in the furnace heater configured to define a furnace process unit in which the semiconductor wafers are thermally processed;

providing a thermal model-based controller including a host computer and a thermal furnace model cooperating to provide a model of thermal behavior of the furnace to as to correlate heater power and process chamber temperature;

providing a furnace power controller including a CPU and a power measurement circuit configured to monitor actual temperature realized within the furnace and control actual power delivered to the at least one heating element;

measuring the temperature realized within the furnace;

measuring the actual power delivered to the at least one heating element via the power measurement circuit;

inputting the realized temperature and the actual power delivered to the at least one heating element to the furnace model-based controller;

calculating a desired load power from the derived thermal furnace model based on the realized temperature and the actual power delivered to the heating element so as to output a desired load power to the furnace power controller; and outputting control commands corresponding to the desired load power from the furnace power controller to the at least one heating element in the furnace heater so as to realize the desired isothermal condition within the processing chamber dynamically during a thermal cycle.

33. A method for controlling a semiconductor processing furnace of the type having a furnace heater carried about a process tube defining a processing chamber therein in which it is desired to realize an isothermal zone during thermal processing cycles to regulate temperature of semiconductor wafers contained therein, the method comprising the steps of:

providing at least one heating zone having a plurality of heating elements in the furnace heater configured to define a furnace process unit in which the semiconductor wafers are thermally processed;

providing a thermal model-based controller including a host computer and a thermal furnace model cooperating to provide a model of thermal behavior of the furnace to as to correlate heater power and process chamber temperature;

providing a furnace power controller including a CPU and a power measurement circuit configured to monitor actual temperature realized within the furnace and control actual power delivered to each of the heating elements;

measuring the temperature realized within the furnace;

measuring the actual power delivered to each of the heating elements via the power measurement circuit;

inputting the realized temperature and the actual power delivered to each of the heating elements to the furnace model-based controller;

calculating a desired load power from the derived thermal furnace model for each of the heating elements based on the realized temperature and the actual power delivered to each of the heating elements so as to output a respective desired load power to the furnace power controller; and outputting control commands corresponding to the desired load power for each of the heating elements from the furnace power controller to each of the heating elements in the furnace heater so as to realize the desired isothermal condition within the processing chamber dynamically during a thermal cycle.

34. A method for controlling a semiconductor processing furnace of the type having a furnace heater carried about a process tube defining a processing chamber therein in which it is desired to realize an isothermal zone during thermal processing cycles to regulate temperature of semiconductor wafers contained therein, the method comprising the steps of:

provifing a plurality of heating zones having at least one heating element in the furnace heater configured to define a furnace process unit in which the semiconductor wafers are thermally processed;

providing a thermal model-based controller including a host computer and a thermal furnace model cooperating to provide a model of thermal behavior of the furnace to as to correlate heater power and process chamber temperature;

providing a furnace power controller including a CPU and a power measurement circuit configured to monitor actual temperature realized within the heating zones of furnace and control actual power delivered to each of the heating elements in each heating zone;

measuring the temperature realized within each heating zone of the furnace;

measuring the actual power delivered to each heating element of each heating zone via the power measurement circuit;

inputting the realized temperature and the actual power delivered to the heating elements of each heating zone to the furnace model-based controller;

calculating a desired load power from the derived thermal furnace model for each of the heating elements in each heating zone based on the realized temperature and the actual power delivered to each of the heating elements in each heating zone so as to output a desired load power to the furnace power controller; and outputting control commands corresponding to the desired load power for each of the heating elements in each heating zone from the furnace power controller to each of the heating elements in each heating zone in the furnace heater so as to realize the desired isothermal condition within the processing chamber dynamically during a thermal cycle.

\* \* \* \* \*